US009077343B2

(12) United States Patent
Gong et al.

(10) Patent No.: US 9,077,343 B2
(45) Date of Patent: Jul. 7, 2015

(54) SENSING FLOOR FOR LOCATING PEOPLE AND DEVICES

(75) Inventors: Nan-Wei Gong, Cambridge, MA (US); Stephen Edward Hodges, Cambridge (GB); Nicolas Villar, Cambridge (GB); Joseph A. Paradiso, Medford, MA (US)

(73) Assignee: Microsoft Corporation, Redmond, WA (US)

( * ) Notice: Subject to any disclaimer, the term of this patent is extended or adjusted under 35 U.S.C. 154(b) by 427 days.

(21) Appl. No.: 13/154,292

(22) Filed: Jun. 6, 2011

(65) Prior Publication Data
US 2012/0309531 A1 Dec. 6, 2012

(51) Int. Cl.
G06F 3/041 (2006.01)
H03K 17/955 (2006.01)
G06F 3/01 (2006.01)

(52) U.S. Cl.
CPC .............. *H03K 17/955* (2013.01); *G06F 3/01* (2013.01); *A63F 2300/1056* (2013.01)

(58) Field of Classification Search
CPC . G01N 15/065; G01N 33/0013; G01N 31/00; A63F 13/02; A63F 13/10; A63F 9/24; H03K 17/962; H03K 17/945; B66B 13/26; G06F 3/044; G09B 13/26; H03J 5/0218
USPC .......................................................... 345/173
See application file for complete search history.

(56) References Cited

U.S. PATENT DOCUMENTS

| | | | |
|---|---|---|---|
| 4,291,303 A * | 9/1981 | Cutler et al. ................... | 345/174 |
| 4,389,711 A * | 6/1983 | Hotta et al. .................... | 713/300 |
| 5,285,690 A | 2/1994 | Koen et al. | |
| 5,844,415 A | 12/1998 | Gershenfeld et al. | |
| 5,914,610 A | 6/1999 | Gershenfeld et al. | |
| 5,914,701 A | 6/1999 | Gersheneld et al. | |
| 5,936,412 A | 8/1999 | Gershenfeld et al. | |
| 6,025,726 A | 2/2000 | Gershenfeld et al. | |
| 6,051,981 A | 4/2000 | Gershenfeld et al. | |
| 6,066,954 A | 5/2000 | Gershenfeld et al. | |
| 6,323,846 B1 * | 11/2001 | Westerman et al. .......... | 345/173 |
| 7,757,457 B2 * | 7/2010 | Zah et al. ................... | 52/747.11 |
| 8,527,235 B2 * | 9/2013 | Tanigawa ...................... | 702/150 |
| 2006/0071674 A1 * | 4/2006 | Jean .............................. | 324/686 |

(Continued)

OTHER PUBLICATIONS

U.S. Appl. No. 61/468,663 by O'Connor, filed Mar, 29, 2011.*

(Continued)

*Primary Examiner* — Andrew Sasinowski
*Assistant Examiner* — Mihir Rayan
(74) *Attorney, Agent, or Firm* — Steve Wight; Micky Minhas

(57) ABSTRACT

A sensing floor to locate people and devices is described. In an embodiment, the sensing floor (or sensing surface), is formed from a flexible substrate on which a number of distributed sensing elements and connections between sensing elements are formed in a conductive material. In an example, these elements and connections may be printed onto the flexible substrate. The sensing floor operates in one or more modes in order to detect people in proximity to the floor. In passive mode, the floor detects signals from the environment, such as electric hum, which are coupled into a sensing element when a person stands on the sensing element. In active mode, one sensing element transmits a signal which is detected in another sensing element when a person bridges those two elements. In hybrid mode, the floor switches between passive and active mode, for example, on detection of a person in passive mode.

20 Claims, 15 Drawing Sheets

(56) References Cited

U.S. PATENT DOCUMENTS

| | | | |
|---|---|---|---|
| 2007/0069021 A1* | 3/2007 | Elrod et al. | 235/451 |
| 2008/0147350 A1* | 6/2008 | Jean | 702/150 |
| 2009/0033343 A1* | 2/2009 | Reynolds et al. | 324/688 |
| 2009/0115735 A1* | 5/2009 | Chuang | 345/173 |
| 2009/0137933 A1* | 5/2009 | Lieberman et al. | 600/595 |
| 2009/0167699 A1* | 7/2009 | Rosenblatt et al. | 345/173 |
| 2009/0221372 A1* | 9/2009 | Casey et al. | 463/36 |
| 2009/0309723 A1* | 12/2009 | Freebody et al. | 340/545.1 |
| 2010/0079387 A1* | 4/2010 | Rosenblatt et al. | 345/173 |
| 2010/0107770 A1* | 5/2010 | Serban et al. | 73/718 |
| 2010/0134604 A1 | 6/2010 | Kieffer et al. | |
| 2010/0164737 A1* | 7/2010 | Lu et al. | 340/665 |
| 2010/0271330 A1* | 10/2010 | Philipp | 345/174 |
| 2010/0271394 A1* | 10/2010 | Howard | 345/633 |
| 2011/0187674 A1* | 8/2011 | Baker et al. | 345/174 |
| 2011/0300938 A1* | 12/2011 | Mao et al. | 463/36 |
| 2012/0162057 A1* | 6/2012 | Tan et al. | 345/156 |
| 2012/0249294 A1* | 10/2012 | O'Connor | 340/5.53 |

OTHER PUBLICATIONS

Zhang, et al., "Footprint tracking and recognition using a pressure sensing floor", Retrieved at << http://ieeexplore.ieee.org/stamp/stamp.jsp?arnumber=05414148 >>, Proceedings of the International Conference on Image Processing, ICIP, Nov. 7-10, 2009, pp. 2737-2740.

Nijholt, et al., "Design of experience and flow in movement-based interaction", Retrieved at << http://www.vf.utwente.nl/~anijholt/artikelen/mig2008.pdf >>, MIG, 2008, pp. 166-175.

Grønbæk, et al., "iGameFloor—A platform for co-located collaborative games", Retrieved at << http://www.interactivespaces.net/data/uploads/papers/6.pdf >>, Proceedings of the International Conference on Advances in Computer Entertainment Technology, ACE, Jun. 13-15, 2007, pp. 8.

Leikas, et al., "Virtual space computer games with a floor sensor control—human centred approach in the design process", Retrieved at << http://citeseerx.ist.psu.edu/viewdoc/download?doi=10.1.1.21.8806&rep=rep1&type=pdf >>, In Proceedings of the First International Workshop on Haptic Human-Computer Interaction, 2001, pp. 119-122.

Orr, et al., "The smart floor: A mechanism for natural user identification and tracking", Retrieved at << http://citeseerx.ist.psu.edu/viewdoc/download?doi=10.1.1.40.9409&rep=rep1&type=pdf >>, Human Factors in Computing Systems, Apr. 1-6, 2000, pp. 9.

Rekimoto, Jun., "SmartSkin: An infrastructure for freehand manipulation on interactive surfaces", Retrieved at << http://citeseerx.ist.psu.edu/viewdoc/download?doi=10.1.1.19.9947&rep=rep1&type=pdf >>, Human Factors in Computing Systems, Apr. 20-25, 2002, pp. 8.

Dietz, et al., "DiamondTouch: a multi-user touch technology", Retrieved at << http://www.merl.com/papers/docs/TR2003-125.pdf >>, TR2003-125, Oct. 2003, pp. 11.

Rangarajan, et al., "The Design of a Pressure Sensing Floor for Movement-Based Human Computer Interaction", Retrieved at << http://ame2.asu.edu/faculty/qian/Publications/PressureSensingFloor_MHCI_FINAL.pdf >>, Smart Sensing and Context, Second European Conference, EuroSSC, Oct. 23-25, 2007, pp. 46-61.

Rangarajan, et al., "The Design of a Pressure Sensing Floor for Movement-based Human Computer Interaction", Retrieved at <<http://ame2.asu.edu/faculty/qian/Publications/PressureSensingFloor_MHCI_FINAL.pdf>>, Smart Sensing and Context, Second European Conference, EuroSSC, Oct. 23-25, 2007, pp. 17.

Kim, et al., "Large-scale Pattern Growth of Graphene Films for Stretchable Transparent Electrodes", Retrieved at <<http://chem.skku.edu/graphene/pdf/Keunsoo1.pdf>>, Feb. 2009, pp. 706-710.

Rogers, et al., "Materials and Mechanics for Stretchable Electronics Science", Retrieved at <<http://rogers.matse.illinois.edu/files%5C2010%5Csciencerev.pdf>>, Mar. 26, 2010, pp. 6.

Lumelsky, et al., "Sensitive Skin", Retrieved at <<http://www.media.mit.edu/resenv/classes/MAS965/readings/sensitiveskin.pdf>>, IEEE Sensors Journal, vol. 01, No. 1, Jun. 2001, pp. 41-51.

Papakostas, et al., "5.3: A Large Area Force Sensor for Smart Skin Applications", Retrieved at <<http://ieeexplore.ieee.org/stamp/stamp.jsp?tp=&arnumber=1037366>>, Proceedings of the IEEE Sensors, 2002, pp. 1620-1624.

Stiehl, et al., "The Huggable: A Therapeutic robotic Companion for Relational, Affective Touch", Retrieved at <<http://icampus.mit.edu/projects/Publications/Huggable/Huggable-StiehlHuggableCCNC06FinalInfo.pdf>>, In IEEE International Workshop on Robot and Human Interactive Communication, 2005, pp. 2.

Dietz, et al., "DiamondTouch: A Multi-user Touch Technology", Retrieved at <<http://www.diamondspace.merl.com/papers/2001_dietz_diamondtouch.pdf>>, ACM Symposium on User Interface Software and Technology, Nov. 11-14, 2001, pp. 219-226.

Richardson, et al., "Z-Tiles: Building Blocks for Modular, Pressure-sensing Floor Spaces", Retrieved at <<http://citeseerk.ist.psu.edu/viewdoc/download?doi=10.1.1.68.2026&rep=rep1&type=pdf>>, Conference on Human Factors in Computing Systems, Apr. 24-29, 2004, pp. 1529-1532.

Wagner, et al., "Electronic Skin: Architecture and Components", Retrieved at <<http://www.deas.harvard.edu/suo/papers/167.pdf>>, In Proceedings of the 13th International Winterschool on New Developments in Solid State Physics—Low-Dimensional Systems, vol. 25, No. 2-3, Nov. 2004, pp. 326-334.

Takei, et al., "Nanowire Active-matrix Circuitry for Low-voltage Macroscale Artificial Skin", Retrieved at <<http://nano.eecs.berkeley.edu/publications/NatureMat_2010_eskin.pdf>>, Nature Materials, vol. 9, Oct. 2010, pp. 10.

Mannsfeld, et al., "Highly Sensitive Flexible Pressure Sensors with Micro-structured Rubber Dielectric Layer", Retrieved at <<http://www-ssrl.slac.stanford.edu/research/highlights_archive/pressuresensor.pdf>>, Oct. 2010, pp. 4.

Jain, et al., "Flexible Electronics and Displays: High-Resolution, Roll-to-Roll, Projection Lithography and Photoablation Processing Technologies for High Throughput Production", Retrieved at <<http://ieeexplore.ieee.org/stamp/stamp.jsp?tp=&arnumber=1468607>>, Proceedings of the IEEE, vol. 93, No. 8, Aug. 2005, pp. 1500-1510.

"All flex", Retrieved at <<www.allflexinc.com>>, Retrieved Date: Jun. 2, 2011, pp. 2.

"T-ink", Retrieved at <<http://www.t-ink.com/>>, Retrieved Date: Jun. 2, 2011, pp. 1.

Addlesee, et al., "The ORL Active Floor", Retrieved at <<http://ieeexplore.ieee.org/stamp/stamp.jsp?tp=&arnumber=626980>>, In IEEE Personal Communications, vol. 04, No. 5, 1997, pp. 35-41.

Schmidt, et al., "Context Acquisition based on Load Sensing", Retrieved at <<http://www.comp.lancs.ac.uk/~albrecht/pubs/pdf/schmidt_ubicomp_2002.pdf>>, Ubiquitous Computing, 4th International Conference, Sep. 29-Oct. 1, 2002, pp. 18.

Paradiso, et al., "The Magic Carpet: Physical Sensing for Immersive Environments", Retrieved at <<http://citeseerx.ist.psu.edu/viewdoc/download?doi=10.1.1.29.3106&rep=rep1&type=pdf>>, In CHI: CHI '97 extended abstracts on Human factors in computing systems, 1997, pp. 2.

Griffith, et al., "LiteFoot: A Floor Space for Recording Dance and Controlling Media", Retrieved at <<http://www.ul.ie/~pal/litefoot/papers/icmc98_paper.pdf>>, Proceedings of the 1998 International Computer Music Conference, International Computer Music Association, 1998, pp. 7.

Kidané, et al., "ISAfloor: A High Resolution Floor Sensor with 3D Visualization and Multimedia Interface Capability", Retrieved at <<http://ame2.asu.edu/projects/floor/papers/ISAfloorPaper_2003.pdf>>, AME Technical Report, 2003, pp. 4.

Middleton, et al., "A Floor Sensor System for Gait Recognition", Retrieved at <<http://ieeexplore.ieee.org/stamp/stamp.jsp?tp=&arnumber=1544421>>, Fourth IEEE Workshop on Automatic Identification Advanced Technologies, Oct. 17-18, 2005, pp. 6.

(56) References Cited

OTHER PUBLICATIONS

Chiang, et al., "Interaction Models for Multiple-Resident Activity Recognition in a Smart Home", Retrieved at <<http://ieeexplore.ieee.org/stamp/stamp.jsp?tp=&arnumber=5650340>>, IEEE/RSJ International Conference on Intelligent Robots and Systems (IROS), Oct. 18-22, 2010, pp. 3753-3758.

Paradiso, et al., "Musical Applications of Electric Field Sensing", Retrieved at <<http://ame2.asu.edu/faculty/dab/classes/papers/paradiso97musical.pdf>>, Computer Music Journal, 1997, pp. 1-28.

Nixon, et al., "Automatic Recognition by Gait", Retrieved at <<http://ieeexplore.ieee.org/stamp/stamp.jsp?tp=&arnumber=4052479>>, Proceedings of the IEEE, vol. 94, No. 11, Nov. 2006, pp. 2013-2024.

Lee, et al., "Gait Analysis for Recognition and Classification", Retrieved at <<http://ieeexplore.ieee.org/stamp/stamp.jsp?tp=&arnumber=1004148>>, Proceedings. Fifth IEEE International Conference on Automatic Face and Gesture Recognition, May 20-21, 2002, pp. 1-8.

Chau, Tom., "A Review of Analytical Techniques for Gait Data. Part 1: Fuzzy, Statistical and Fractal Methods", Retrieved at <<http://www.prismlab.org/journal_papers/2001achau.pdf>>, 2001, pp. 49-66.

Zimmerman, T. G., "Personal Area Networks: Near-field Intrabody Communication", Retrieved at <<http://cims.clayton.edu/itsd4303/UsefulStuff/zimmerman.pdf>>, IBM Systems Journal, vol. 35, No. 3-4, 1996, pp. 609-617.

\* cited by examiner

SENSING FLOOR FOR LOCATING PEOPLE AND DEVICES

BACKGROUND

In ubiquitous computing applications, computing technology is integrated into the environment such that users may not even be aware of its operation in the background. In order for a ubiquitous computing application to be able to automatically perform operations on behalf of people (e.g. to control lighting or multimedia systems, to display messages in a location close to a user etc), the underlying computing system needs to be able to sense information about the state of the environment in which it operates. In particular, the system may want to know where people are in the environment, who those people are and what those people are doing in order to be able to determine what automated actions would be beneficial.

Existing systems for locating people typically monitor people entering and exiting rooms and require people to carry an electronic location device of some kind, such as an RFID (radio-frequency identification) tag. Alternatively, pressure sensing mats may be used at the entrances to rooms, however, such devices only indicate occupancy of a room and do not identify the particular occupant(s).

The embodiments described below are not limited to implementations which solve any or all of the disadvantages of known location systems.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

A sensing floor to locate people and devices is described. In an embodiment, the sensing floor (or sensing surface) is formed from a flexible substrate on which a number of distributed sensing elements and connections between sensing elements are formed in a conductive material. In an example, these elements and connections may be printed onto the flexible substrate. The sensing floor operates in one or more modes in order to detect people in proximity to the floor. In passive mode, the floor detects signals from the environment, such as electric hum, which are coupled into a sensing element when a person stands on the sensing element. In active mode, one sensing element transmits a signal which is detected in another sensing element when a person bridges those two elements. In hybrid mode, the floor switches between passive and active mode, for example, on detection of a person in passive mode.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Figure 1:
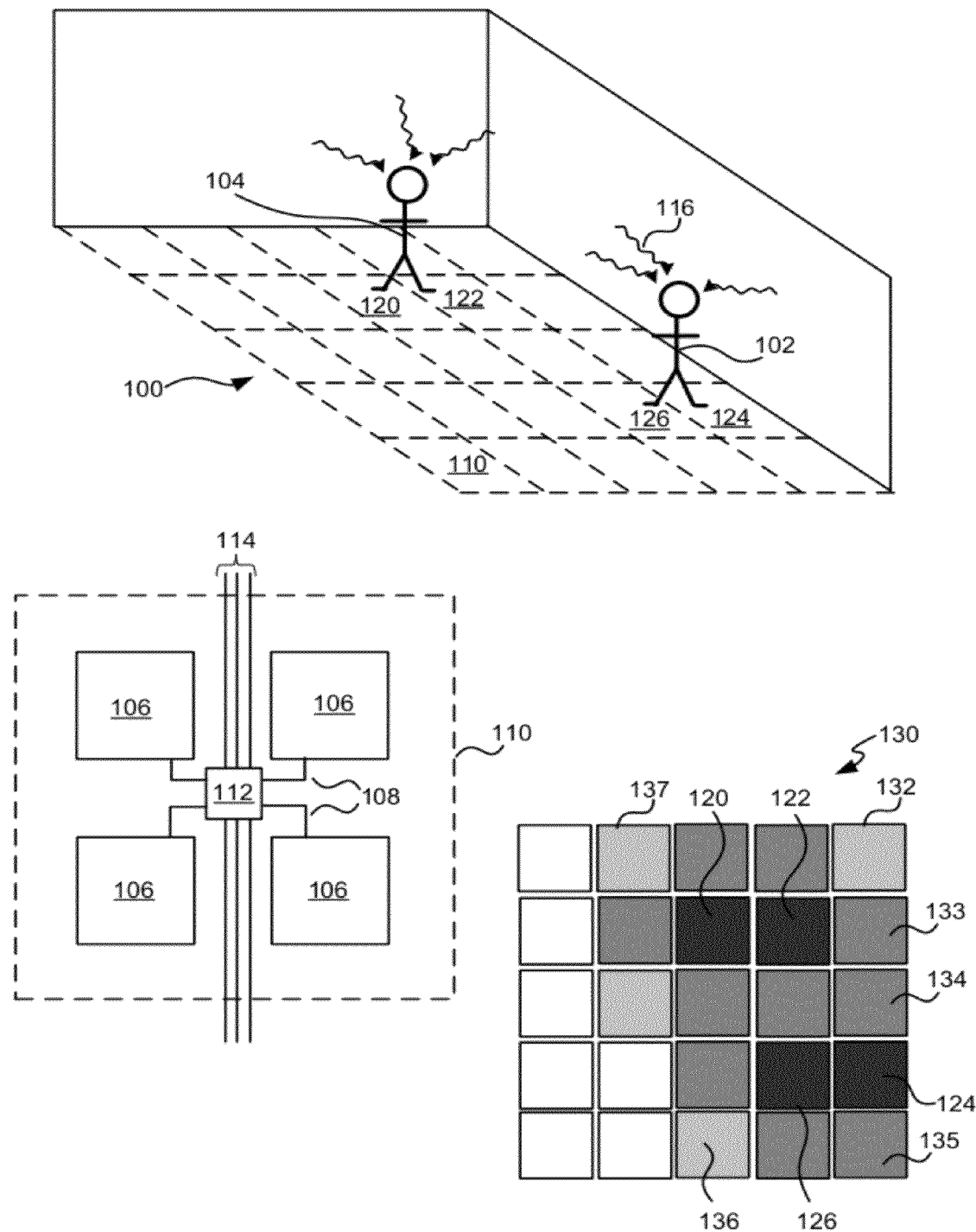
FIG. 1 shows a schematic diagram of a sensing floor on which two people are walking and an example signal strength diagram.

FIG. 1 shows a schematic diagram of a sensing floor 100 (or sensate floor) on which two people 102, 104 are walking and an expanded view of an example of a unit area 110 in the floor 100. The sensing floor 100 is formed from a flexible substrate on which a plurality of distributed sensing elements 106 and connections 108 between those elements are formed in a conductive material. In the example shown in FIG. 1, the 'tiles' or unit areas 110 are arranged in an array or matrix to form the sensing floor 100 and each unit area 110 (as indicated by the dotted gridlines) of the sensing floor in the upper diagram comprises four sensing elements 106, each of which is connected (by connections 108) to a small PCB 112 on which there is a microcontroller. The PCB 112 (which may also be referred to as a signal conditioning or processing module) is connected to a bus arrangement of electrical connections 114 which connects the microcontroller to a master controller (not shown in FIG. 1) which may be located away from the sensing floor and may control many microcontrollers. In order to minimize any cross-coupling between the data lines in the bus 114, each data line may be separated by a grounded trace. The bus arrangement 114 may also connect a microcontroller in one unit area 110 to microcontrollers in other unit areas. Separate power lines (not shown in FIG. 1) may be used to distribute power to each PCB 112, and in an example arrangement, dedicated ground and power lines may run along the left and right edges of the substrate and these tracks may be wider than other connections on the substrate in order to reduce trace impedance and hence power drop. As shown in the first example flow diagram 200 in FIG. 2, the sensing elements 106, which may also be referred to as electrodes or antennas, are arranged to detect signals from the environment which relate to the presence of a user or other activity close to a sensing element 106 (block 202). By analyzing the signals received at different sensing elements 106, the location of people 102, 104 on the floor can be determined (block 204).

There are many signals in the environment, (as indicated by the wavy arrows 116 in FIG. 1), which may be detected by the sensing elements 106 and one example is mains (or electric) hum (at 50 or 60 Hz), which is usually considered as adding noise to sensing systems. An implementation of the sensing floor system shown in FIG. 1, however, uses detection of this mains hum to locate people within the room. A person 102, 104 acts as an antenna and causes mains hum to be coupled into nearby sensing elements 106. This sensing technique may be referred to as passive capacitive sensing as the sensing elements 106 are detecting noise coupled into the elements and not signals which have been generated within the sensing floor itself. In the example shown in FIG. 1, mains hum is coupled into sensing elements 106 within unit areas 120-126 and from analysis of the actual sensing elements which detected signals, it can be determined that there are two people 102, 104 (e.g. as unit areas 122 and 124 are sufficiently spaced that the signals cannot be the result of a single person on the floor or by using more complex analysis methods). FIG. 1 also shows an example signal strength diagram 130 when using passive capacitive sensing where the darker shading (e.g. in unit areas 120-126) indicates larger detected signal strengths than surrounding areas (e.g. in unit areas 132-137).

It is not necessary for the person to be standing directly on the sensing element 106 and the sensing floor 100 may be covered with a standard insulating flooring material, such as carpet or carpet tiles. Any references to a person standing on a floor in the following description refers to either the person standing directly on the sensing floor or a person standing on the flooring material (or other surface covering) which covers the sensing floor. The profile of the detected signal can also be used to detect the pressure applied by the person 102, 104 and consequently may be used in identification/tracking of people within the room, as is described in more detail below.

Mains hum is just one example of a signal which may be detected by sensing elements 106 and used to determine the location of people on the sensing floor 100. In other examples, other signals may be used, such as signals emitted by mobile telephones or other portable electronic devices, e.g. GSM or 3G signals, Bluetooth®, WiFi, NFC (near-field communication) signals, etc. The design of the sensing elements 106 may be tailored to the particular signals that are to be detected and in some examples, different sensing elements may be included which are tailored to detecting different kinds of signals and this is described in more detail below (for example, with reference to FIG. 6).

The flexible substrate from which the sensing floor 100 is formed may be made from any suitable material. In some examples, the substrate may be fabric or other woven/knitted material and the sensing elements 106 and electrical connections 108, 114 (which may also be referred to as 'connectors) may be formed within the fabric/material or on a surface of the fabric/material in a conductive material (e.g. copper) using any appropriate method. In another example, the electrical connections and sensing elements may be printed (e.g. using copper or a metallic nanoparticle ink) onto a surface of the substrate (e.g. a polyester film), e.g. using inkjet or other printing technology (for example, as manufactured by Conductive Inkjet Technology from Cambridge, UK or using T-Ink™ technology). In a further example, a copper-on-kapton substrate may be used (e.g. as manufactured by All Flex Flexible Circuits, LLC). Other techniques which may be used to manufacture a flexible substrate include roll-to-roll lithography and additive printing of noble-metal conductors, organic conductors and semiconductors. Roll-to-roll lithography can provide very high resolution but is relatively high cost and additive printing produces materials which typically do not have suitable electrical and/or mechanical characteristics.

Figure 2:
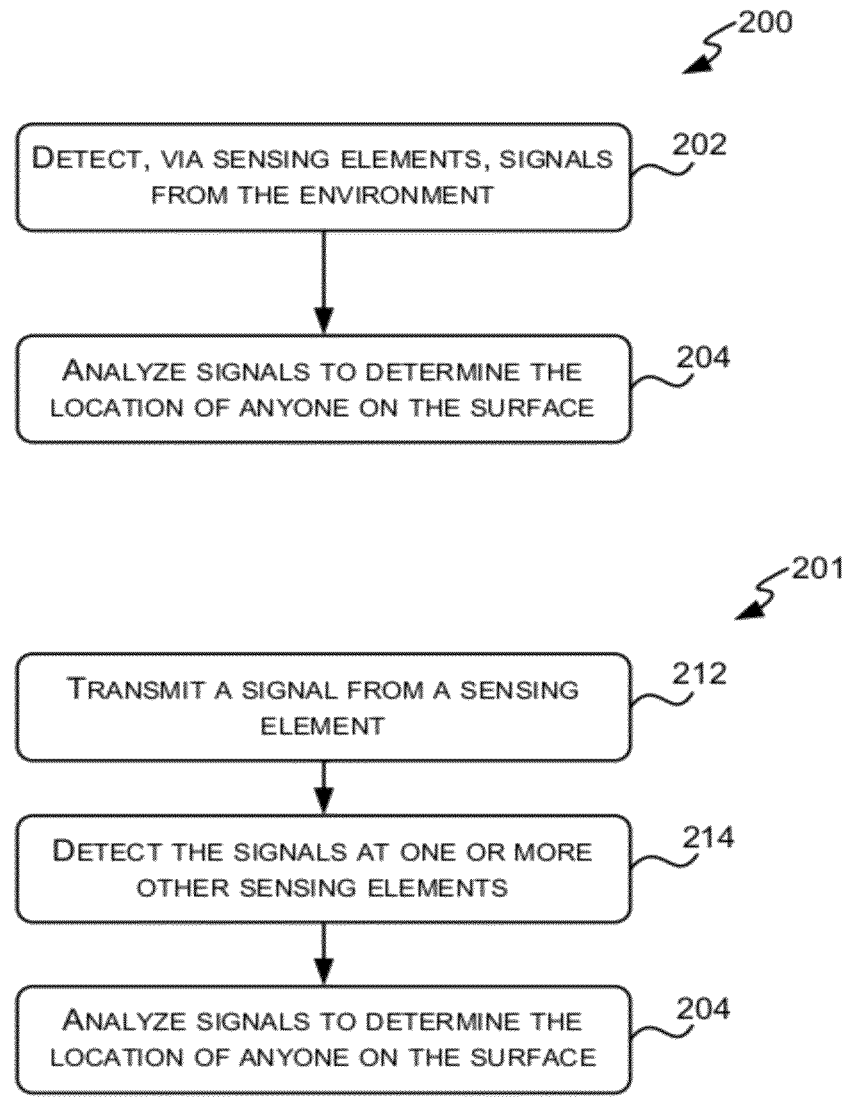
FIG. 2 shows two flow diagrams of example methods of operation of a sensing floor.
Figure 3:
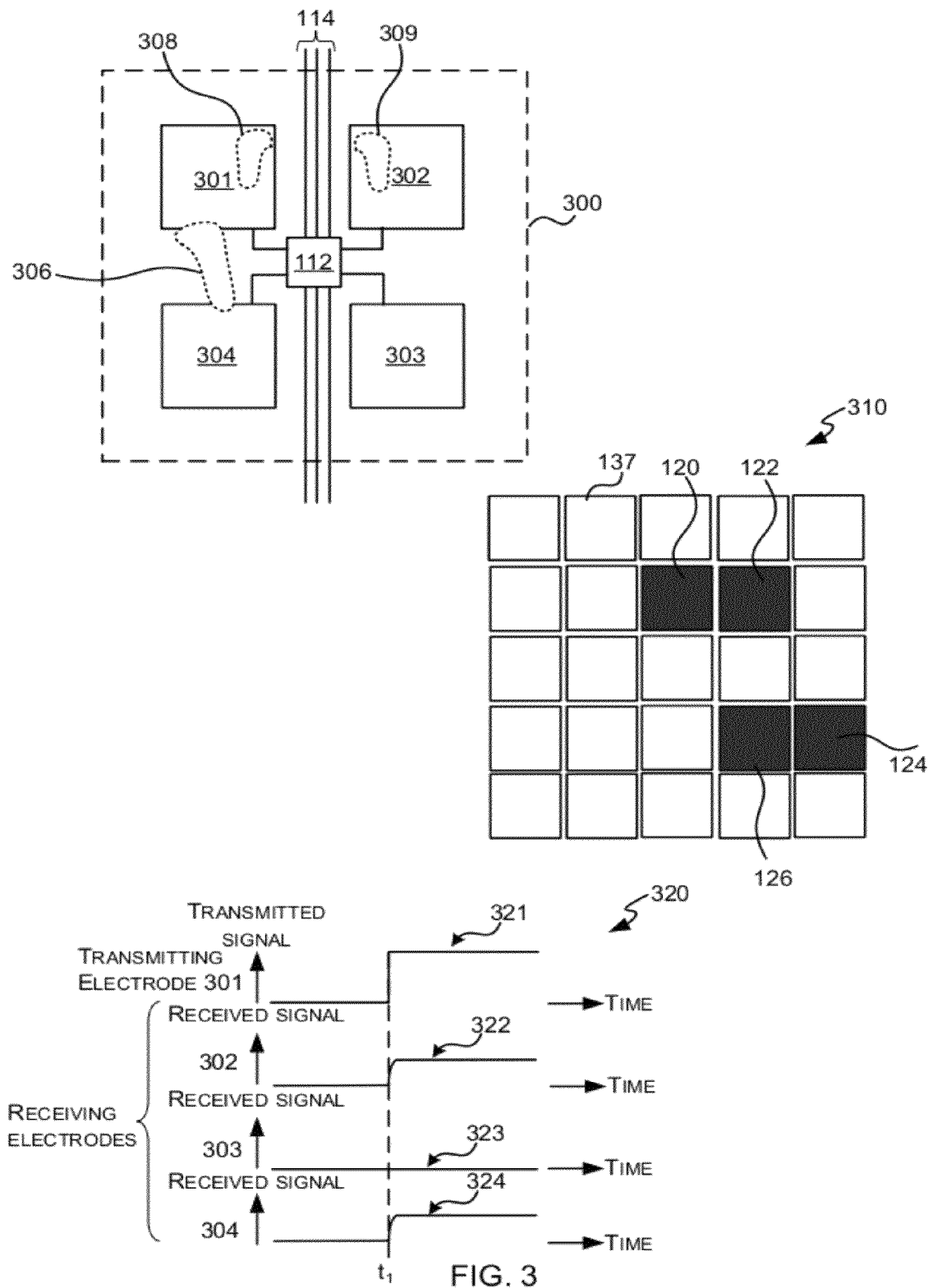
FIG. 3 comprises a schematic diagram of another example of a unit area of a sensing floor, another example signal strength diagram and a diagram showing example transmitted and received signals.

In the example described above, the sensing floor 100 used passive capacitive sensing to detect the location of people on the floor. In addition to, or instead of, using passive capacitive sensing, the sensing floor may use active capacitive sensing, as can be described with reference to FIGS. 2 and 3. FIG. 3 comprises a schematic diagram of another example unit area 300 of the sensing floor, an example signal strength diagram 310 when using active capacitive sensing and a diagram 320 showing example transmitted and received signals. The second flow diagram 201 in FIG. 2 is of an example method of operation of the sensing floor. Through use of active capacitive sensing, a sensing floor system may be arranged to perform remote range sensing, e.g. it may be able to detect a person's foot as it approaches the sensing floor in addition to when it is on the floor.

In the example shown in FIG. 3, the arrangement of the unit area 300 of the sensing floor is the same as shown in FIG. 1, however, one of the sensing elements 301 is used to transmit a signal (block 212) and the remaining sensing elements 302-304 are used for detecting (or receiving) the signals transmitted by the transmitting element 301 (block 214). By analyzing which other sensing elements received the transmitted signal, the location of people on the sensing floor can be determined (block 204). In order to transmit the signal (in block 212), the sensing element 301 may be excited by a signal from the microcontroller (on the PCB 112), e.g. a 5V square wave pattern.

The example signal strength diagram 130 shows the detected signal strengths when using passive capacitive sensing where the black shading (e.g. in unit areas 120-126) indicates detected signals and the absence of shading (e.g. in unit area 137) indicates no detected signals. This diagram 310 is analogous to the diagram 130 shown in FIG. 1 for passive capacitive sensing.

In some example implementations, synchronous detection of edges in signals may be used (e.g. in order to filter out background noise), as can be described with reference to the example signal diagram 320. If the transmitted signal 321 from sensing element 301 is taken high (at time $t_1$, as indicated by the dotted line in diagram 320), detection of a corresponding step in one or more other sensing elements 302-304 may be used to infer the location of people (in block 204). A person may couple the transmitted signal from the transmitting sensing element (or electrode) 301 to another electrode by bridging or straddling the elements either with a single foot (as indicated by the dotted outline 306) or using both feet (as indicated by the dotted outlines 308, 309) depending on the size and arrangement of the sensing elements (in an example implementation, each sensing element may be approximately 12 cm by 12 cm). In the example shown in FIG. 3, a person bridges sensing elements 301 and 304 with a single foot (dotted outline 306) and as a result, a step increase (at time $t_1$) in the detected signal 324 on sensing element 304 can be seen. Alternatively (or in addition) a person bridges sensing elements 301 and 302 with one foot on (or above) each sensing element (dotted outlines 308, 309) and as a result, a step increase (at time $t_1$) in the detected signal 322 on sensing element 302 can also be seen.

It will be appreciated that the signals shown in FIG. 3 are by way of example only. Any effects of the presence of noise on the detected signals have not been included and in order to mitigate the effects of any noise synchronous detection may be used. For consistency the detected signals may be analyzed at a time shortly after $t_1$, rather than by looking for an edge at $t_1$ (e.g. because of the short time taken for the received signal to stabilize, as shown in FIG. 3) Other techniques may be used (in addition or instead) to mitigate the effects of noise, such as averaging the signals over a short period of time. In other examples, the edge may be produced by taking a signal low instead of high or the system may look for multiple edges (e.g. a rising edge followed by a falling edge or a continuous wave such as a square wave pattern).

The examples described above with reference to FIG. 3 illustrate one of the two possible scenarios which may occur when a user's body comes into the electric field between the transmit and receive electrodes. The operation described above may be referred to as transmit mode where the signal is coupled through the person which effectively increases the amplitude of the signal on receive electrodes. The user or object has to be relatively close to the transmit conductor and is acting like an extension of the transmit electrode. In the second scenario, which may be referred as shunt mode, the object or body of the user is not connected to the transmit electrode. Instead, it blocks the electrical field between electrodes, i.e. coupling to the room ground dominates. As a result the signal will drop as the foot approaches the sensor during shunt mode, which is the opposite of transmit mode. Based on these two different modes, it is possible to detect the remote movement of the body near the electrodes.

Although the above description refers to sensing element 301 acting as a transmitting electrode and sensing elements 302-304 acting as receiving electrodes, the transmitting electrode may change (e.g. one of the elements 302-304 may transmit a signal instead of sensing element 301 which may instead act as a receiving electrode) and in some examples, more than one sensing element may be used to transmit a signal for detection by other sensing elements. Furthermore, in some examples, a dedicated transmitting electrode may be provided within the sensing surface and used to transmit a signal instead of using one of the sensing elements (e.g. by re-purposing that sensing element).

Figure 4:
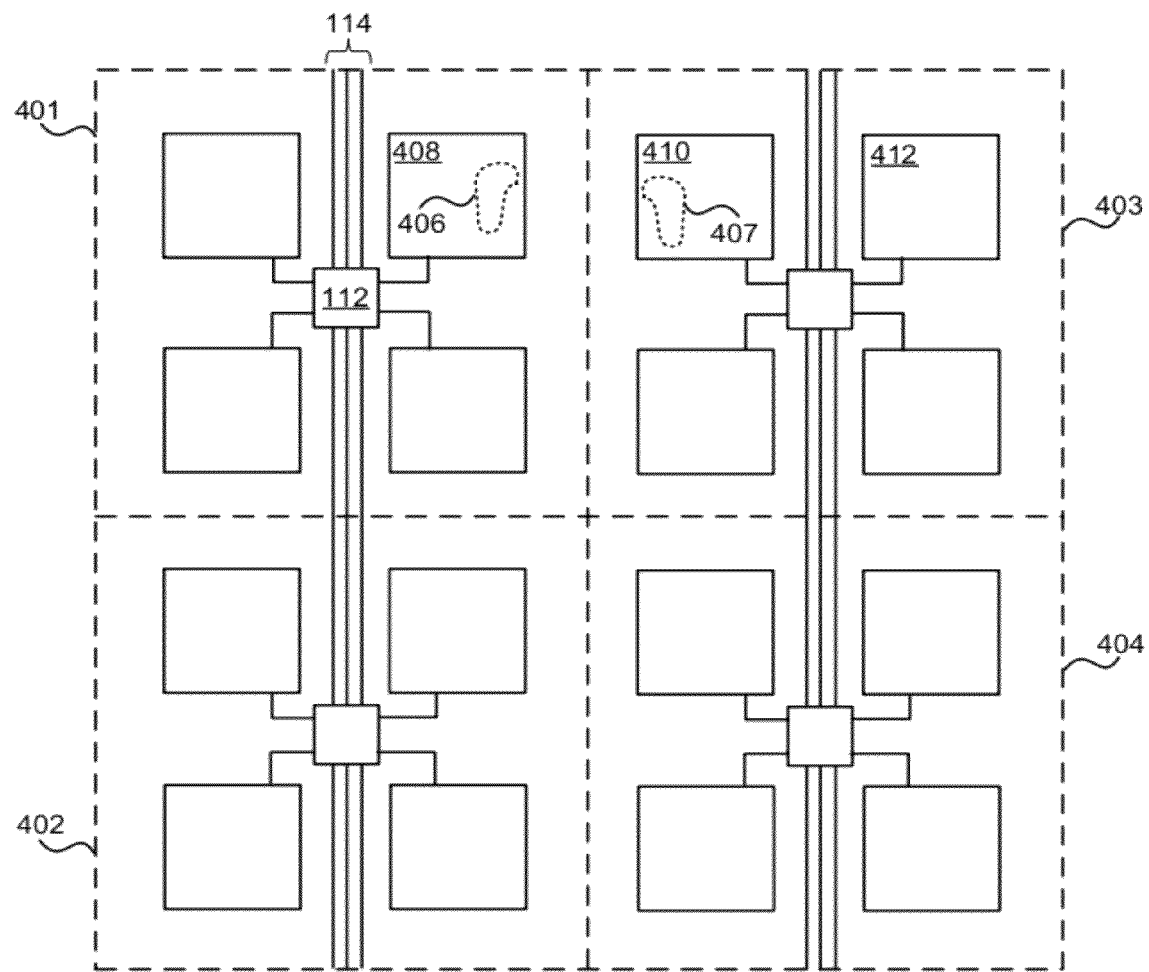
FIG. 4 shows a schematic diagram of four example unit areas of a sensing floor.

The above description with reference to FIG. 3 relates to coupling of signals within a unit area 300. However, it will be appreciated that a person may bridge sensing elements between unit areas, as shown in FIG. 4. FIG. 4 shows a schematic diagram of four unit areas 401-404 of a sensing floor. In this example, each unit area is the same but in other examples, there may be differences between neighboring unit areas. In the example shown a person (indicated by dotted outlines 406-407 of their two feet) bridges a transmitting sensing element 408 in a first unit area 401 and a receiving sensing element 410 in a second unit area 403. In order that the system can distinguish which transmitted signal is being coupled into the receiving sensing element 410, e.g. whether the signal was transmitted from sensing element 408 or sensing element 412, there may be synchronization between unit areas (e.g. between microcontrollers which control each unit area). The synchronization may be performed between microcontrollers (located on PCBs 112) over the bus (e.g. as formed by electrical connections 114) or may be under the control of the master controller (not shown in FIG. 4). Where the synchronization is performed by the master controller, a global clock synchronization line may be provided to each unit cell (e.g. as part of the bus 114).

Various techniques may be used to distinguish between transmitting sensing elements, such as time division multiplexing where only one sensing element in the sensing floor, or only one sensing element within a particular region (e.g. within any group of four unit areas) of the sensing floor (where the region is wider than a person's typical stride), transmits an edge at a particular time. In another example, different transmitting sensing elements may transmit a different pattern of edges and by analyzing the detected pattern, the transmitting sensing element can be identified.

Figure 5:
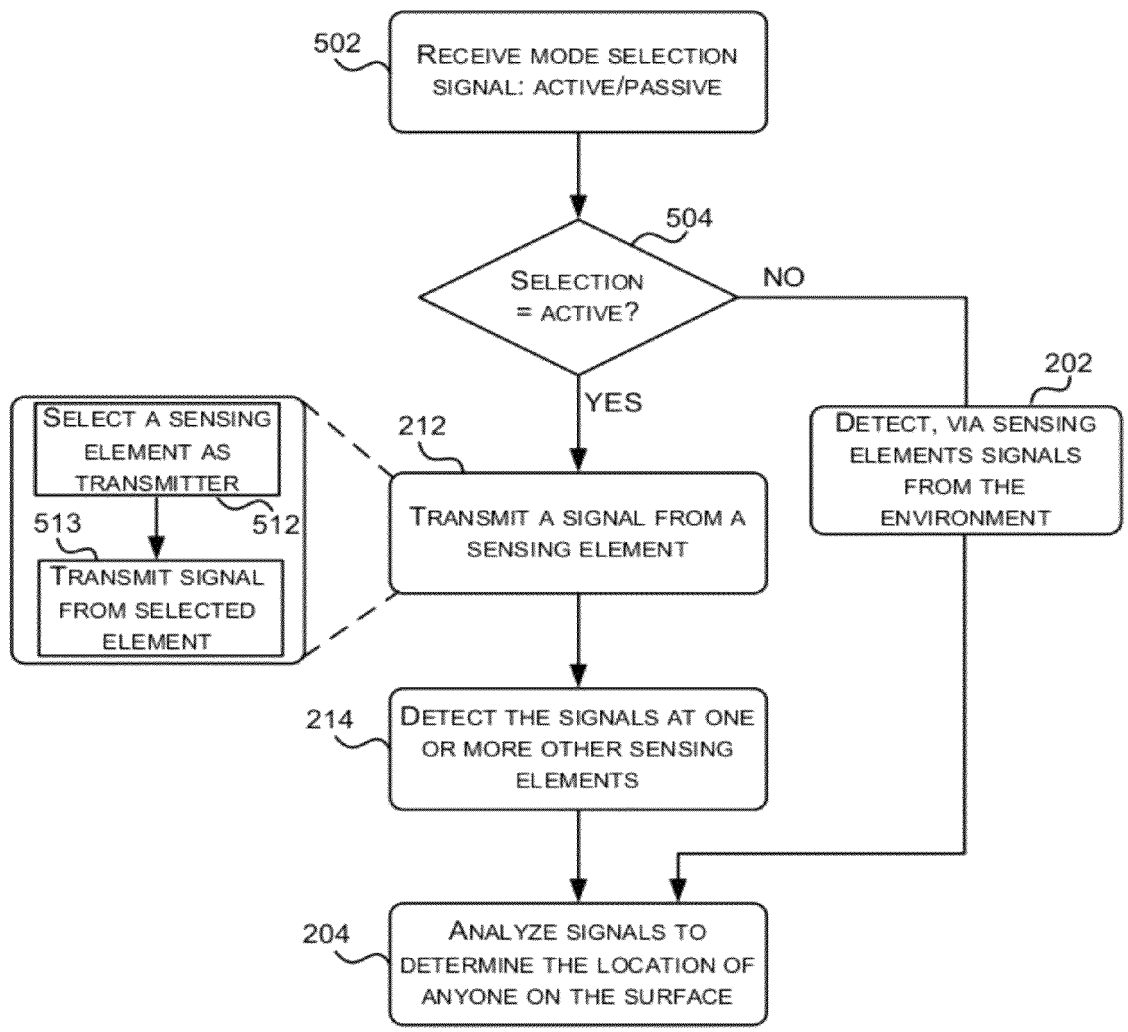
FIG. 5 is a flow diagram of an example method of operation of a sensing floor which has two modes of operation: a passive sensing mode and an active sensing mode.

As described above, active capacitive sensing (as described with reference to FIGS. 3 and 4) can be used in combination with, or independently from, passive capacitive sensing (as described with reference to FIGS. 1 and 2). FIG. 5 is a flow diagram of an example method of operation of a sensing floor which has two modes of operation: a passive sensing mode and an active sensing mode. This arrangement may be referred to as a hybrid sensing architecture. In this example, the mode of operation is controlled by the master controller which sends a mode selection signal to the microcontrollers on the PCBs 112 in each unit area (received in block 502). In some examples, the same signal may be sent to all microcontrollers so that the entire floor operates in the same mode at any point in time, or different signals may be sent to different microcontrollers, so that parts of the floor may be operating in passive mode at the same time as other parts of the floor are operating in active mode. In other examples, however, the mode selection signal may be generated locally (e.g. by the microcontroller) or there may be no mode selection signal (i.e. block 502 is omitted) and the mode may be selected based on other parameters or substantially at random. Where there is no mode selection signal generated by a master controller, this may be referred to as 'autonomous mode selection'.

Depending upon the mode selection signal received (in block 504), the unit area of the sensing floor operates either in passive mode (blocks 202 and 204) or active mode (blocks 212, 214 and 204). As described above, in active mode, the same sensing element may be used each time as the transmitting element (in block 212), or the method may first involve selecting the sensing element to transmit a signal (block 512) and then transmitting a signal from the selected sensing element (block 513). The selection (in block 512) may be made locally (e.g. by the microcontroller on PCB 112) or by the master controller. Using either mode, the detected signals (from block 202 or 214) are analyzed to determine the location of anyone on the sensing floor (block 204).

Use of passive mode saves computing power and reduces the power consumption since it is not necessary to pulse the transmitting electrode. Active mode, however, can provide more information about the depth and can also be used to detect movement between electrodes. Use of a hybrid scheme, for example as shown in FIG. 5, therefore provides all of these aspects. In addition, active mode can be used for signaling between different platforms (nodes, surfaces) and people (with active tags), as described in more detail below.

In the examples described above, a sensing floor operates in passive mode (as described with reference to FIGS. 1 and 2) or active mode (as described with reference to FIGS. 3 and 4) or uses a hybrid sensing scheme (as described with reference to FIG. 5). In further examples, different parts of a sensing floor may operate in different ways, for example, there may be some unit cells in a sensing floor which only operate in passive mode and other unit cells in the sensing floor which only operate in active mode or which can operate in either passive or active mode. In another example, some unit cells in a sensing floor may operate in a fixed mode (passive/active) and other unit cells may be arranged for hybrid operation.

Figure 6:
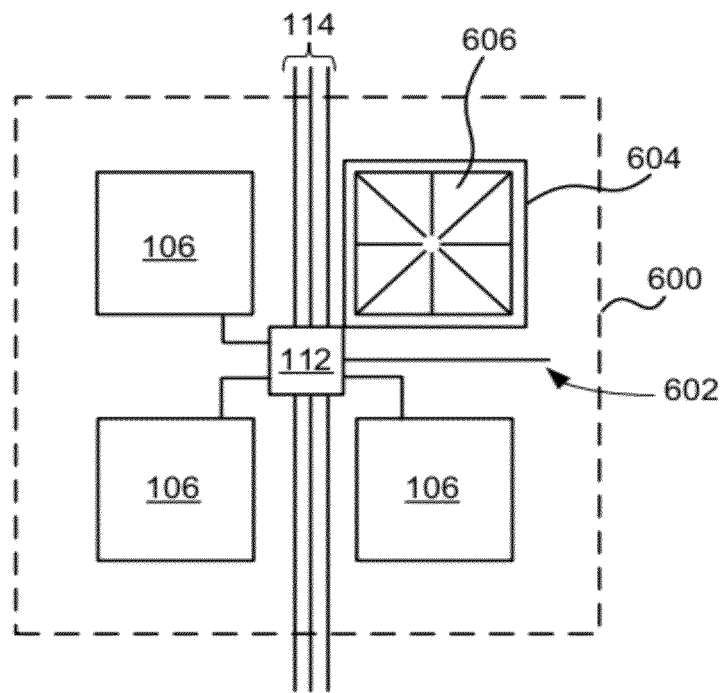
FIG. 6 shows a schematic diagram of another example unit area of a sensing floor.

As described above, other signals may be used, in addition to, or instead of capacitive sensing (whether active or passive) to determine the location of people on a sensing floor. Other examples include sensing signals emitted by mobile devices, such as cellular telephones or other portable electronic devices, e.g. GSM signals or other cellular systems like Bluetooth®, WiFi, ZigBee®, NFC signals, etc and where appropriate, the design of the sensing elements may be tailored to the particular signal to be detected. FIG. 6 shows a schematic diagram of another example unit area 600 of a sensing floor which comprises three sensing elements 106 which may be used for active and/or capacitive sensing, a GSM antenna 602 and a NFC antenna 604 (where the two antennas 602, 604 are also considered examples of sensing elements), although in other examples, a sensing floor or a unit area of a sensing floor may only comprise only a single type of sensing element or other subset of these three types of sensing elements. Other types of sensing elements (e.g. a Bluetooth® antenna) may also be used and a unit area may comprise any combination of sensing elements. Different unit areas within a sensing floor may comprise the same combination of types of sensing elements or a different combination of types of sensing elements (e.g. where a particular type of sensing element is large or power hungry, such a sensing element may only be included in a subset of the unit cells within a sensing floor).

The GSM antenna 602 (or an antenna arranged to detect mobile communications signals according to another standard) is arranged to detect signals from mobile devices which may be carried by people walking on the sensing floor. These signals may be transmitted by a mobile device when the user is making a phone call, uploading/downloading data, or when the device is otherwise signaling to a cellular base station or a nearby device. In some examples, the signals detected (in block 202 of FIG. 2) via the sensing element may be used to locate a device and hence infer the location of a person on the sensing floor (in block 204). For example, the signal response versus sensing element location could be plotted for a GSM device held an appropriate distance above the surface, which may be at or around 1 m although other distances may be appropriate. The plotted signal strength against sensor location may be integrated and/or averaged over the GSM connection time, which may be approximately 6 second long although other times may be appropriate.

The NFC antenna 604 shown in FIG. 6 comprises a loop antenna and the area of metal 606 within the loop, if present, may be patterned to incorporate breaks in the conductive material in order to reduce eddy currents. This NFC antenna 604 may be used to detect signals in the environment (in block 202) which are transmitted by mobile devices which include an NFC reader and which are located within a few meters of the antenna. Again detection of such signals enables the location of the device, hence a person on the sensing floor to be inferred (in block 204). In a manner similar to that of the GSM device, the signal response may be plotted for a NFC device held an appropriate distance above the surface, which may be at or around 30 cm from the surface although other distances may be appropriate. The plotted signal strength against sensor location may be integrated and/or averaged over the NFC connection time. Initial results indicate that the NFC results may provide a more linear drop off of signal strength than the GSM results, however it is clear that either could be used for determining location.

In the case of a Bluetooth® antenna (not shown in FIG. 6), the antenna may be arranged to detect signals from mobile devices which are communicating with other nearby devices over Bluetooth® (e.g. a mobile device connected to a Bluetooth® headset).

Any of the examples described above, or shown in FIGS. 1, 3, 4 and 6, may comprise one or more additional sensors such as a microphone or pressure sensor. In an example, the sensing floor may comprise contact microphones which may be glued onto the flexible substrate and connected to one of the connections (e.g. bus connections 114) or to the PCB 112 on the substrate. A contact microphone may be used to detect mechanical stimulus and hence infer the location of a person on the sensing floor. A microphone-like effect may also (or instead) be provided as a result of a DC offset between sensing electrodes 106 and ground connections (not shown in the FIGs) which results in an arrangement which operates as a (DC-biased) condenser microphone. Mechanical stimulus of the sensing floor structure (which may be around the electrode and need not be on the electrode) in such an arrangement, results in detection of a signal which is indicative of the stimulus provided and can be used to infer the location of a person on the sensing floor.

In addition to (or instead of) identifying the location of people on the sensing floor, some of the signals detected may be used to identify the particular people. In the example of signals generated by mobile devices (e.g. GSM/NFC/Bluetooth®), GSM and NFC signals within the detected signals may be used to identify a particular device and this can be mapped to (or otherwise correlated with) a particular person. In some examples, the people may carry a mobile device for the purpose of user identification or this may be integrated within their clothing (e.g. a shoe emitting a characteristic varying electric field). In other examples, characteristics of the signals detected, such as the strength of the capacitive signal, may be used either to identify people or to distinguish between people on the sensing floor. In some examples, different signals or methods may be used to locate people and to identify people (e.g. active/passive capacitive sensing may be used to locate people and signals generated by mobile devices may be used to identify people at the known locations). In another example, if someone wants to know the location of a particular person, they may call them (e.g. using the GSM network). As described above, the signals may be used to identify a particular device (and hence the particular person) and its location. This information may then be communicated to the calling party. This approach to user tracking may be considered less invasive than some other tracking methods because the user being tracked knows who is tracking them and when, because they will have received the call and/or the call will be stored in a call log within their device.

By analysis of signals detected over time over the floor, the motion of a person may be tracked across the floor and in some examples, a person may be identified based on characteristics of this motion. Examples of characteristics include the gait of the person and the start or end point of their track. For example, the sensing floor signatures can be analyzed to detect and determine different parts of a user's walking motion, which may include but are not limited to forefoot strike, heel strike, and mid-swing. The different parts of a user's walking motion can be distinguished and determined by analyzing the signal strength, signal variation over time, location of one or more sensors with a signal, and other appropriate characteristics of one or more sensing floor signatures to differentiate and determine not only the part of the user's gait, but also characterize a person's gait. In another example, where a person starts/ends at their desk or where a person starts/ends at a computer where they are logged in, or where a person enters/exits the room through an access controlled entrance, the person's identity is known from another system and by correlating this information from the other system with the tracked motion, the identity of the person who is being tracked can be determined. Other information which may be correlated with the location data from the sensing floor to determine the identity of a person includes the WiFi location of a person's laptop or other WiFi enabled device (e.g. a smartphone) and in other examples, alternative wireless protocols may be used.

In addition to (or instead of) identifying the location and/or identity of people on the sensing floor, some of the signals detected may be used to determine the activities of people on the sensing floor. For example, signals generated by mobile devices may be used to detect whether a person is making a phone call, has an active data connection (e.g. a GSM data connection), is using a Bluetooth® device, performing an RFID scan, etc). Such activity information may assist a ubiquitous computing application in controlling the environment to support the activity of the person. For example, where a person is making a voice call, any speakers close to the person may be switched off or reduced in volume (e.g. email notification 'pings' on a computer may be muted).

Figure 7:
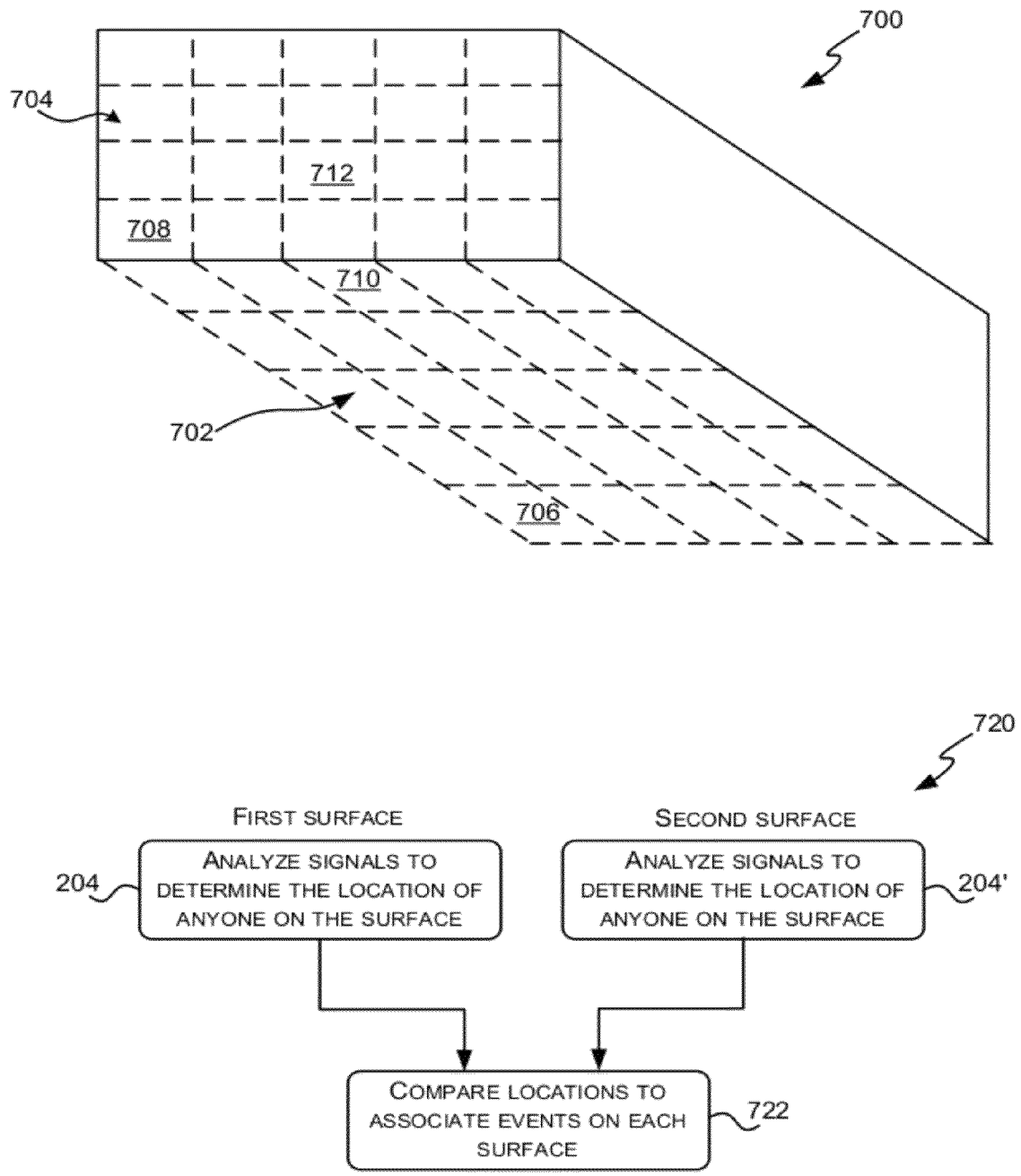
FIG. 7 shows a schematic diagram of a room in which there are two sensing surfaces and a flow diagram of an example method of operation of the sensing system.

The technology and methods described above in relation to a sensing floor may also be used in an alternative configuration, such as a sensing wall or other sensing surface (e.g. desk top, table top etc, which may also be referred to as a sensate surface). In some examples, there may be multiple sensing surfaces within a room, as shown in the schematic diagram 700 of FIG. 7. In this diagram, like FIG. 1, the sensing surfaces 702, 704 are shown as a grid of unit areas 706, 708, 710, 712 where each unit area may be as shown in FIG. 1, 3, 4 or 6 or as described in any of the examples above. The schematic diagram 700 in FIG. 7 shows a sensing floor 702 and a sensing wall 704 and the unit areas 706, 708, 710, 712 in both sensing surfaces may be the same or may be different. In some examples, the two sensing surfaces may be separate and in other examples, the sensing wall 704 may simply be an extension of the sensing floor 702 which turns through 90° to continue up the wall. Where there are multiple sensing surfaces, each sensing surface may have a separate master controller or the sensing surfaces may all be connected to the same master controller.

In a room where there are multiple sensing surfaces, the signals detected may be analyzed to associate events on different surfaces, as shown in the flow diagram 720, where an event is used in this context to refer to detection of a person in proximity to the surface. For example, if a person is detected (in block 204) in proximity to unit area 710 on the first sensing surface 702 (which in the configuration shown in FIG. 7 is the floor) and a person is detected (in block 204') in proximity to unit area 712 on the second sensing surface 708 (which in the configuration shown in FIG. 7 is a wall), the analysis (in block 722) may infer that both events relate to a single person who is proximate to both the floor unit cell 710 and wall unit cell 712. In some examples, the location of each hand may be identified separately on a sensing surface and the system may perform analysis to determine that the two detected hands are likely to belong to the same person and to correlate with a location of a person as detected on another sensing surface (e.g. the sensing floor). In an example the analysis (in block 722) may be performed based on the physical distance between the events (e.g. in a similar manner to the analysis described earlier with reference to FIG. 1) or alternative methods may be used (e.g. based on known identity or tracked motion across a surface).

Where there are multiple sensing surfaces, each surface may use the same sensing methods to detect location/activity/identity of people or different sensing methods may be used. In an example, passive capacitive sensing may be used in the first sensing surface 702 (the floor) and active capacitive sensing may be used in the second sensing surface 704 (the wall).

Having made an association between sensing events on two or more surfaces, this information may be used in many different ways. In a first example, if the identity of the person is known through their interaction with one sensing surface (e.g. using any of the methods described earlier), the identity of the person interacting with the other sensing surface(s) is now also known. In a second example, the association may result in the transfer of data from a display or computing system associated with one sensing surface to a display or computing system associated with the other sensing surface. For example, where the first sensing surface is a worktop on which images (or other data) are displayed and the second sensing surface is a wall, onto which images (or other data) can be displayed, the association may cause images being viewed on the worktop to be displayed (in addition or instead) on the wall. The actual transfer of data between systems may be performed over a communication link or network between the systems as a result of the association made or in some examples, the data may be transmitted through the user between the two sensing surfaces, with one or more sensing elements in one surface acting as transmitting electrodes and one or more sensing elements in the other surface acting as receiving electrodes. In an example, a transmit-receive mode may be used that can transmit information from a sensing floor to a user's foot and from the user's hand to a sensing surface on a table top. Where data is transmitted through a user, the user may wear a device on their foot/shoe with one electrode facing the body and one facing the floor. Where the sensing surface is not a floor, such a device may be worn on another item of clothing (e.g. a glove) or part of the body (e.g. hand/finger). The transmission of signals through the body is described in more detail in U.S. Pat. No. 5,914,701 assigned to Massachusetts Institute of Technology.

Although the description above relates to association of events on sensing surfaces which are close to each other such that a person can be proximate to both surfaces at the same time, the methods may be extended to enable association between events on surfaces which are separated in time and/or space. For example, where a person interacts with a first sensing wall, walks across a sensing floor and then interacts with a second sensing wall, events on the first and second sensing walls may be associated and this may, for example, be used to trigger transfer of content from one sensing wall to another or from a display or computing system associated with one sensing wall to a display or computing system associated with the other sensing wall. It will further be appreciated that such transfers need not be confined to a single room. In an example, data may be transferred from a system associated with a sensing wall in one room (where this system may be a display system) to a system associated with a sensing wall in another room (which may be a second display system) and the user may be tracked across a sensing floor between the two sensing walls. Such an arrangement may enable a user to move an item displayed on one system to the other system for display.

In addition to, or instead of, transmitting data between sensing surfaces (or systems associated with sensing surfaces), data may be transmitted between a sensing surface and a user device, such as a mobile phone or other portable computing device which is carried by a person. The data may be transmitted wirelessly from the surface to the device or may be transmitted through the person. In an example, the NFC antenna 604 may be used to transmit a code to a portable computing device or to cause a phone to ring.

Where a sensing floor, or unit area of a sensing floor, comprises multiple types of sensing elements and/or multiple modes of operation, all the sensing elements may be operational (e.g. capable of detecting signals) all of the time. In some examples, however, some of the sensing elements may be non-operational (e.g. switched off) until a trigger signal is received, e.g. as a result of a signal detected by an operational sensing element. This can be described with reference to the example unit area 800 shown in FIG. 8 and the workflow shown in FIG. 9. Such an implementation reduces the power used by the system when there is little or no activity on the sensing floor. Other techniques may be used in addition, or instead, to reduce the power consumption of the sensing floor, for example, by power cycling unit cells such that typically only a subset of the unit cells are operational (e.g. adjacent unit cells are switched on and off in anti-phase). Such cycling may, for example, be controlled by the master controller.

Figure 8:
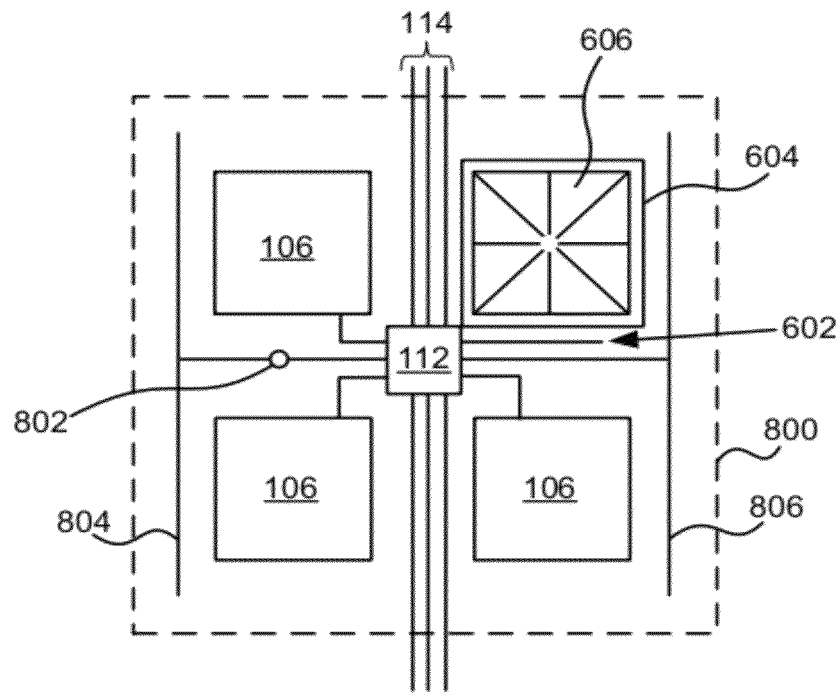
FIG. 8 shows a schematic diagram of another example unit area of a sensing floor.

FIG. 8 shows a schematic diagram of another example unit area 800 of a sensing floor which comprises three sensing elements 106 which may be used for active and/or capacitive sensing, a GSM antenna 602, a NFC antenna 604 and a piezoelectric pickup 802 (where the two antennas 602, 604 and piezoelectric pickup are also considered examples of sensing elements). It will be appreciated that in other examples, a sensing floor or a unit area of a sensing floor may only comprise only a single type of sensing element or any other subset of the types of sensing elements shown in FIG. 8. The unit area 800 also shows ground lines 804, 806 which may also be present (but are not shown) in the other examples described herein (e.g. in the examples of FIGS. 1, 3, 4 and 6).

Figure 9:
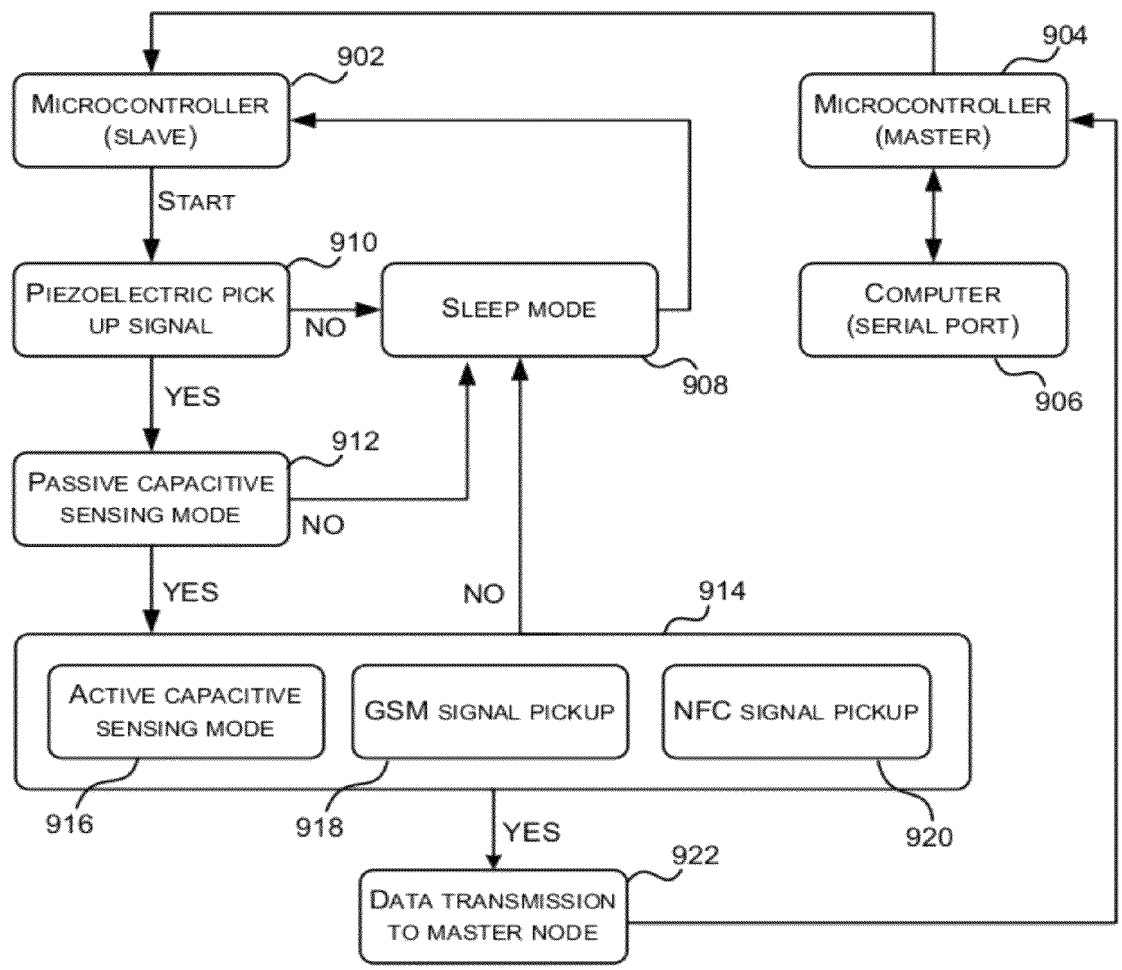
FIG. 9 shows an example firmware workflow for a system comprising a sensing floor as shown in FIG. 8.

FIG. 9 shows an example firmware workflow for a system comprising a sensing floor as shown in FIG. 8 and which implements a power reduction technique as described above. The workflow shows a slave microcontroller 902 which corresponds to the microcontroller located on PCB 112 in each unit cell 800. The workflow also shows a master microcontroller 904 which communicates with each slave microcontroller (e.g. via an I²C bus). The analysis described above (e.g. in blocks 204 and 722 of the flow diagrams) may be performed by the master microcontroller 904 and/or by a computer 906 which is in communication with the master microcontroller 904.

In the example shown in FIG. 9, a unit cell of the sensing floor remains in sleep mode (block 908) until a signal is detected via the piezoelectric pickup 802 ('Yes' in block 910). At this point, the unit cell operates in passive mode (block 912) until a signal is detected at a sensing element ('Yes' in block 912) and this triggers the unit cell to move to an operational state (indicated by block 914) where it is performing active capacitive sensing (block 916) and is capable of detecting GSM (or other cellular telephony) signals (block 918) via the GSM antenna 602 and NFC signals (block 920) via the NFC antenna 604. Any signals detected in this operational state (block 914), or data representative of the signals, are transmitted to the master node (block 922), e.g. over an I²C bus. Using this method, areas of interest within the sensing floor may be determined using passive capacitive sensing (in block 912) and then those areas can be stimulated for active sensing. If no signals are detected in the passive mode (block 912) for a period of time, the unit cell may return to sleep mode (block 908).

It will be appreciated that although FIG. 9 shows the unit cell waking based on the piezoelectric pickup 802 and then only becoming fully operational based on passive capacitive sensing (in block 912), this is by way of example only and other implementations may wake based on signals from different sensing elements and/or may wake in more/fewer stages. In an example, the unit cell may wake based on the signal from a microphone within the unit cell or based on a signal generated by the floor itself when acting like a condenser microphone (due to DC offsets between electrodes and ground), as described above. Where a particular type of sensing is considerably more power hungry than other sensing types (e.g. NFC sensing), then it may be particularly beneficial not to have the sensing circuitry operational all the time and to use a trigger from a particular sensor to cause the sensing circuitry to be switched on. Although this example describes a trigger signal within a unit cell that causes the unit cell to wake from the sleep mode, in other examples, the trigger signal may result in the waking of a group of unit cells (e.g. a cluster of neighboring unit cells) or the entire sensing floor.

The workflow shown in FIG. 9 shows examples of the flow of data using single ended and double ended arrows. It will be appreciated that these indicate only an example of the data flows and in variations of the data flow shown, data over any link may be unidirectional or bidirectional (irrespective of whether it is depicted with a double or single ended arrow in FIG. 9). Data may also flow in directions not shown in FIG. 9 in addition to, or instead of, any of the data flows shown in FIG. 9.

Figure 10:
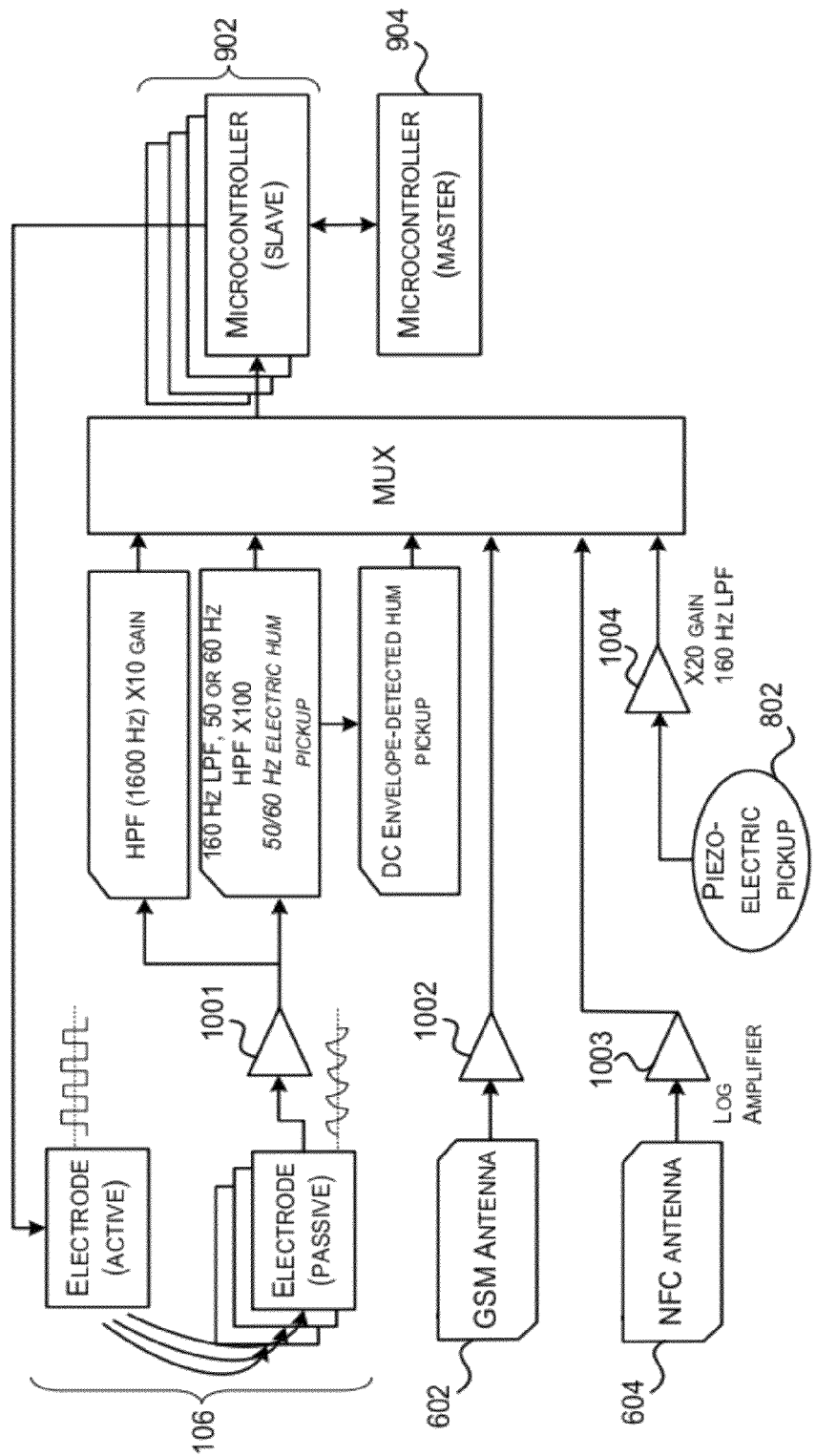
FIG. 10 shows a block diagram of the example sensing floor shown in FIG. 8.
Figure 11:
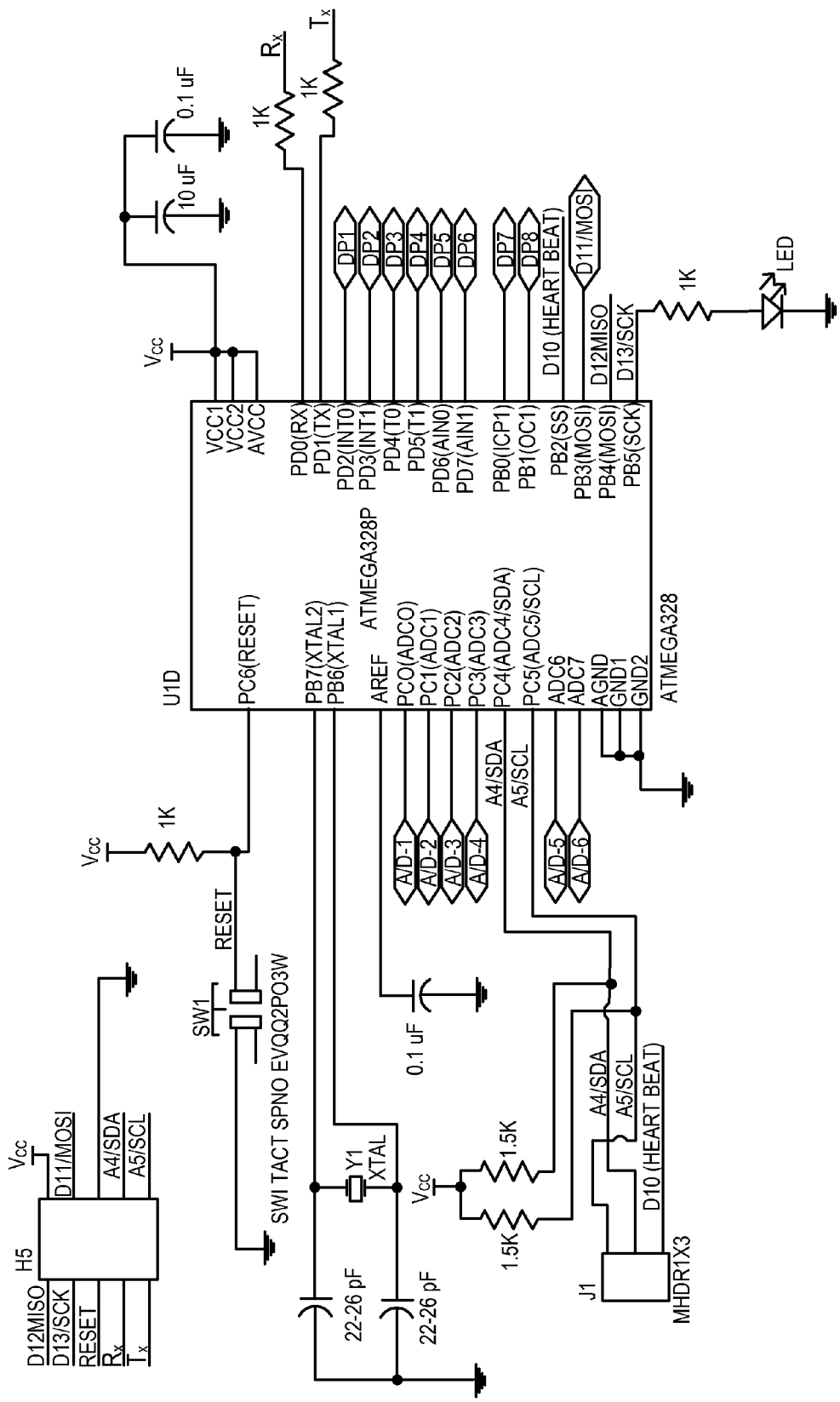
FIGS. 11-13 comprise circuit schematics for elements shown in FIG. 10.
Figure 12:
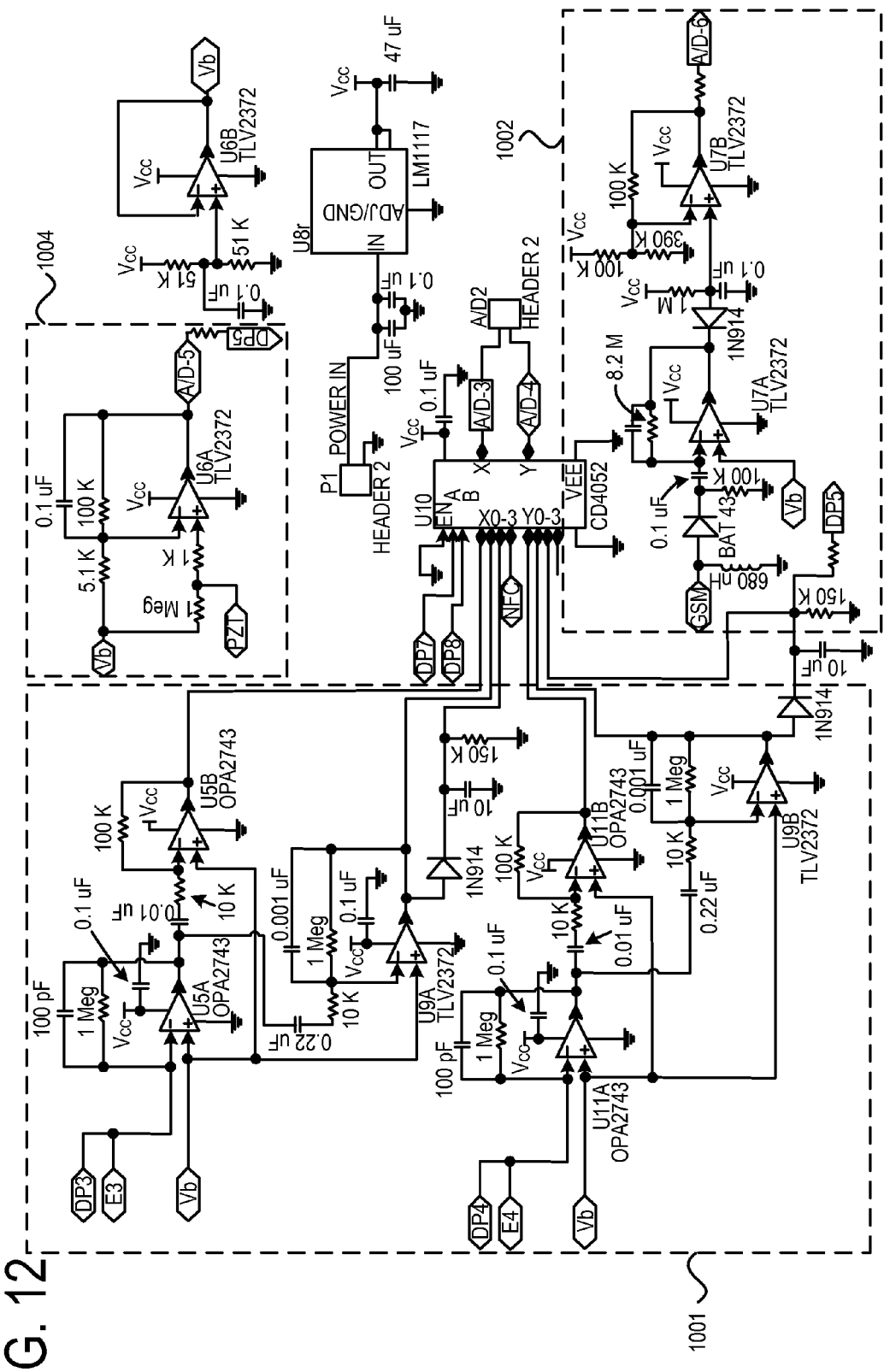
Figure 13:
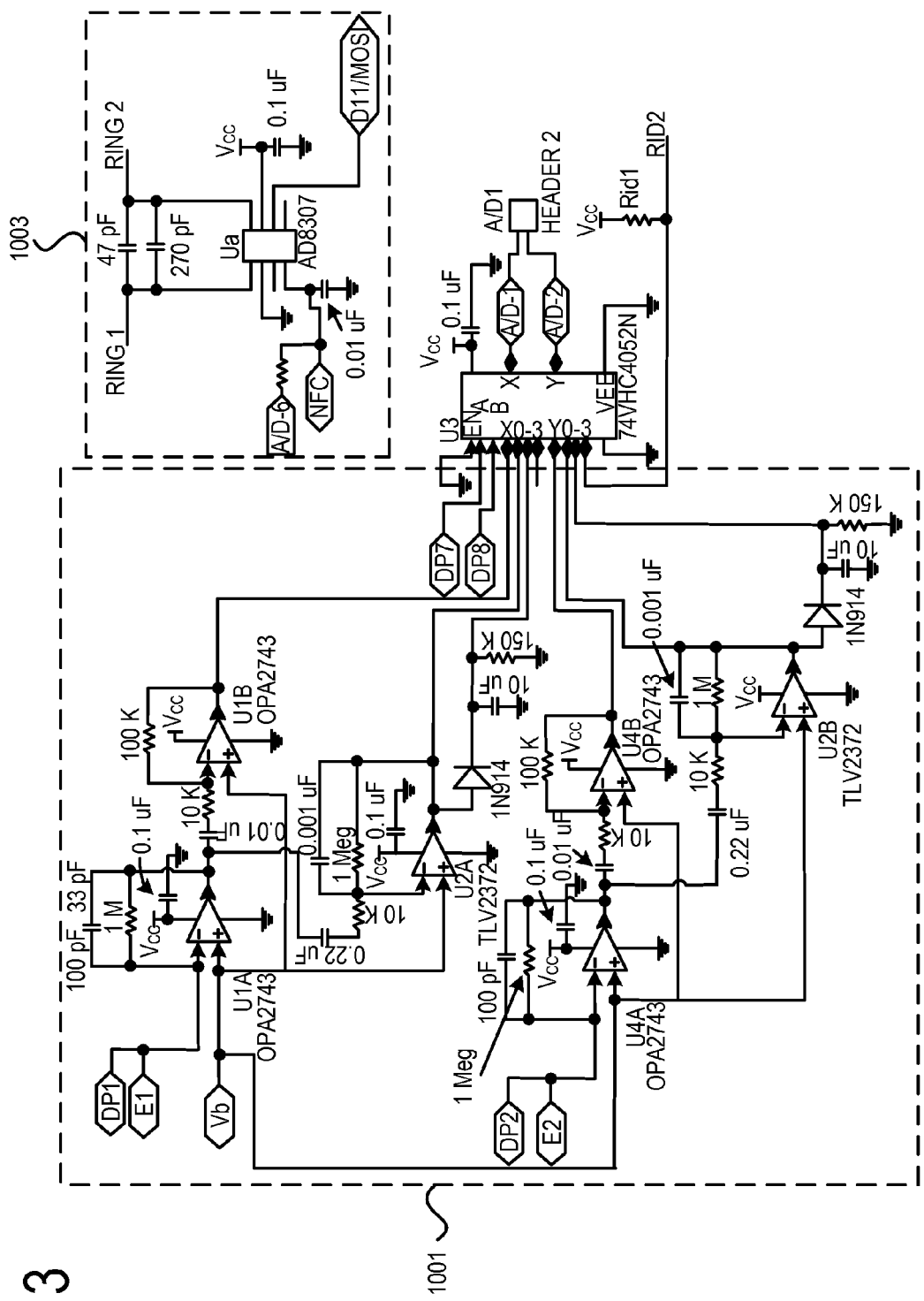

FIG. 10 shows a block diagram of the example sensing floor shown in FIG. 8 and FIGS. 11-13 comprise circuit schematics for elements shown in FIG. 10. The circuit schematic in FIG. 11 shows the microcontroller and peripherals setting. The circuit schematic in FIG. 12 shows the active/passive capacitive sensing circuit 1001 where E* indicates the connection to an electrode 106 on the substrate. DP* indicates the connection to the microcontroller digital output which is used to create a signal in the active mode. FIG. 12 also shows the DC envelope detector 1002 for the GSM signal pickup from the antenna 602 and the low pass filter 1004 for the piezoelectric sensor pickup 802 (which in this example is a 160 Hz low pass filter with ×20 gain). The circuit schematic in FIG. 13 also shows the active/passive capacitive sensing circuit 1001 and in addition shows the log amplifier circuit 1003 for detecting signals from NFC devices (using NFC antenna 604). The circuitry shown in these schematics which detect signals from mobile devices which have been received via an antenna (e.g. GSM antenna 602 or NFC antenna 604) may be referred to as 'receiver circuitry'.

Figure 14:
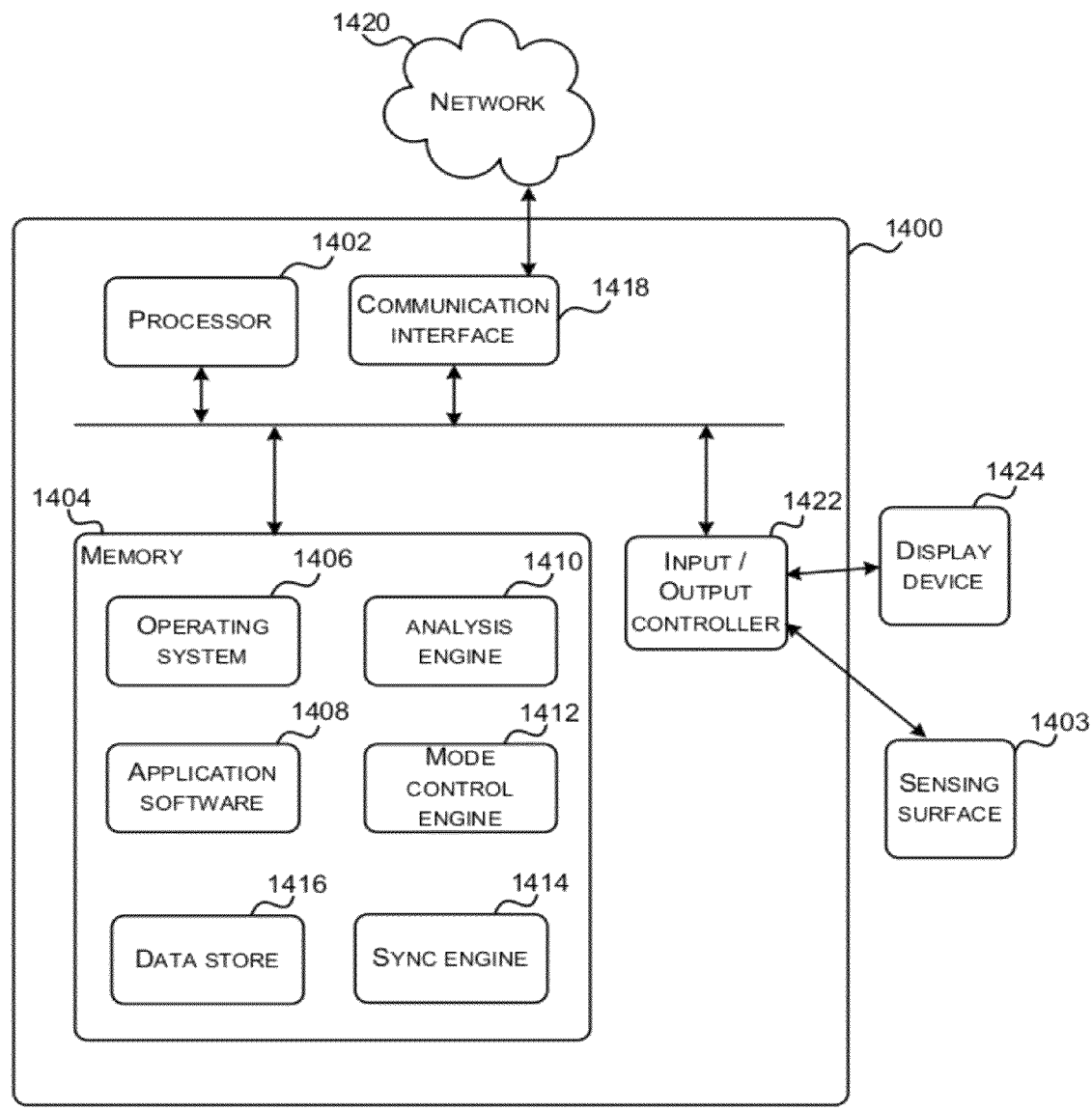
FIG. 14 illustrates an exemplary computing-based device in which embodiments of the methods described herein may be implemented.

FIG. 14 illustrates various components of an exemplary computing-based device 1400 which may be implemented as any form of a computing and/or electronic device, and in which embodiments of the methods described above may be implemented. For example, the computing-based device 1400 may be the master microcontroller 904 or the computer 906 which is connected to the master microcontroller 904, as shown in FIG. 9.

Computing-based device 1400 comprises one or more processors 1402 which may be microprocessors, controllers or any other suitable type of processors for processing computer executable instructions to control the operation of the device in order to control the operation of a sensing surface 1403 (e.g. a sensing floor), such as described above. In some examples, for example where a system on a chip architecture is used, the processors 1402 may include one or more fixed function blocks (also referred to as accelerators) which implement a part of the method of control of the sensing floor in hardware (rather than software or firmware).

The computer executable instructions may be provided using any computer-readable media that is accessible by computing based device 1400. Computer-readable media may include, for example, computer storage media such as memory 1404 and communications media. Computer storage media, such as memory 1404, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (memory 1404) is shown within the computing-based device 1400 it will be appreciated that the storage may be distributed or located remotely and accessed via a network 1420 or other communication link (e.g. using communication interface 1418).

Platform software comprising an operating system 1406 or any other suitable platform software may be provided at the computing-based device to enable application software 1408 to be executed on the device. The application software 1408 may include an analysis engine 1410 arranged to analyze signals received from the sensing surface 1403 and determine the location of people on the floor (e.g. as in block 204). The analysis engine 1410 may also be arranged to compare locations of people and associate events on different sensing surfaces (e.g. as in block 722 of FIG. 7). The application software 1408 may further include a mode control engine 1412 arranged to select a mode of operation for all or part of the sensing floor 1403 and transmit a mode selection signal to the appropriate slave microcontroller (e.g. as is received in block 502 of FIG. 5). This mode control engine 1412 may also perform selection of sensing elements as transmitter (as in block 512) or this may be performed locally by the microcontroller in the unit cell of the sensing floor (e.g. the microcontroller on PCB 112). A synchronization engine 1414 may also be provided which synchronizes the operation of different unit cells within a sensing floor (or within multiple sensing floors), as described above. In addition to storing software, the memory 1404 may also comprise a data store 1416 for storing information generated by the computing-based device and/or signals received from the sensing surface 1403. This data store may also be used to store data used in identifying particular people, e.g. characteristics of their motion, their desk location, device information (e.g. Bluetooth® ID) etc. The identification may be performed by the analysis engine 1410 or by a separate identification engine (not shown in FIG. 14). As described above, the identification of people may involve communication with other systems (e.g. door entry systems, login systems etc) and in such an example, the computing-based device 1400 may communicate with the other system(s) via the communication interface 1418.

The computing-based device 1400 also comprises an input/output controller 1422 arranged to receive data from the sensing surface 1403, such as sensor data and to output control signals, where required, to the sensing surface. Although only a single sensing surface 1403 is shown in FIG. 14, in other examples, the computing-based device 1400 may control multiple sensing surfaces. These surfaces may be located within the same room (e.g. as in FIG. 7) or in different rooms. The input/output controller 1422 may also receive information from other devices (e.g. user input devices, not shown in FIG. 14) or a display device 1424. The display device 1424 may be separate from or integral to the computing-based device 1400 and may provide a graphical user interface (GUI). In an example, the GUI may show a representation of the sensing floor 1403 and the location (and identity, where known) of any people detected on the sensing floor.

As described earlier, the data generated by the sensing surface may provide an input to a ubiquitous computing system. In an example, the computing-based device 1400 may be part of this ubiquitous computing system or may connect to it via the communication interface 1418.

Although the examples described above are shown formed from electrical connections in a single layer on the flexible substrate with a discrete PCB 112 mounted on the flexible substrate, it will be appreciated that other arrangements may alternatively be used. In one example, the functionality of the PCB (including the microcontroller) may be integrated within a single chip which may be bonded onto the substrate. In another example, the functionality/tracks of the PCB may be implemented in the substrate itself and if required, components (e.g. the microcontroller and any discrete capacitors or resistors) may be bonded directly to the flexible substrate. In another example, a multilayer structure may be used to provide the electrical routing on the flexible substrate (e.g. by printing on both sides of a flexible substrate, by using multiple layers of flexible substrate each with a single layer of printed electrical connections and structures, or by using a true multilayer process with conductive layers separated by dielectric layers).

Where a discrete PCB 112 is used, it may be necessary to protect the PCB from damage as people walk over the floor. The protection may, for example, be provided by a lid or cap placed over the PCB with a corresponding recess provided in the back of the floor covering. In another example, the sensing floor may be installed such that the electrical connections and PCB are mounted face down with the PCBs fitting into recesses in the supporting flooring structure (e.g. metal floor tiles). Where the sensing floor is installed on a conductive supporting flooring structure, the floor may be spaced away from this structure (e.g. with a piece of wood) to reduce pickup of unwanted electrical noise or suppression of the sensed signal in either passive or active sensing modes. Other electrical noise reduction measures may be used (in addition or instead), for example, grounding the supporting structure or using a magnetic layer underneath the sensing elements. In another example, where a multilayer structure is used, a ground plane may be provided in a layer under that which forms the sensing elements and connections between sensing elements, e.g. a ground plane may be printed on the other side of the flexible substrate.

Although the present examples are described and illustrated herein as being implemented in a sensing floor system, the system described is provided as an example and not a limitation. As those skilled in the art will appreciate, the present examples are suitable for application in a variety of different types of sensing surfaces and in surfaces of different sizes. FIG. 7 shows the technology being used as a sensing surface on a wall and the technology may also be used to provide worktop surfaces or other types of sensing surfaces. Furthermore, although the surfaces shown in the FIGs. are large and typically extend across the entire floor, this is by way of example only. In some examples, smaller areas may be produced, for example to provide a sensing mat (e.g. for playing computer games in which case the computer 906 shown in FIG. 9 may be a gaming console). Any reference herein to a sensing floor is therefore by way of example only and may alternatively refer to any other sensing surface.

The particular arrangements of unit cell described above and shown in FIGS. 1, 3, 4, 6 and 8 provide just some examples of possible arrangements. Other examples may have more than the four electrodes per microcontroller in the arrangement of FIG. 1. Although many of the sensing elements for capacitive sensing are shown as being square in shape, this is by way of example and any other shape elements may be used. In order to optimize use of space, tessellating shapes may be used, such as triangles or rectangles. Furthermore, although the sensing floors are described as being formed from unit cells with one microcontroller per unit cell, in some examples, the unit cells may not all be the same (or may all be different) and in other examples, there may be no concept of a unit cell and the sensing floor may comprise an arrangement of sensing elements which are controlled centrally.

Figure 15:
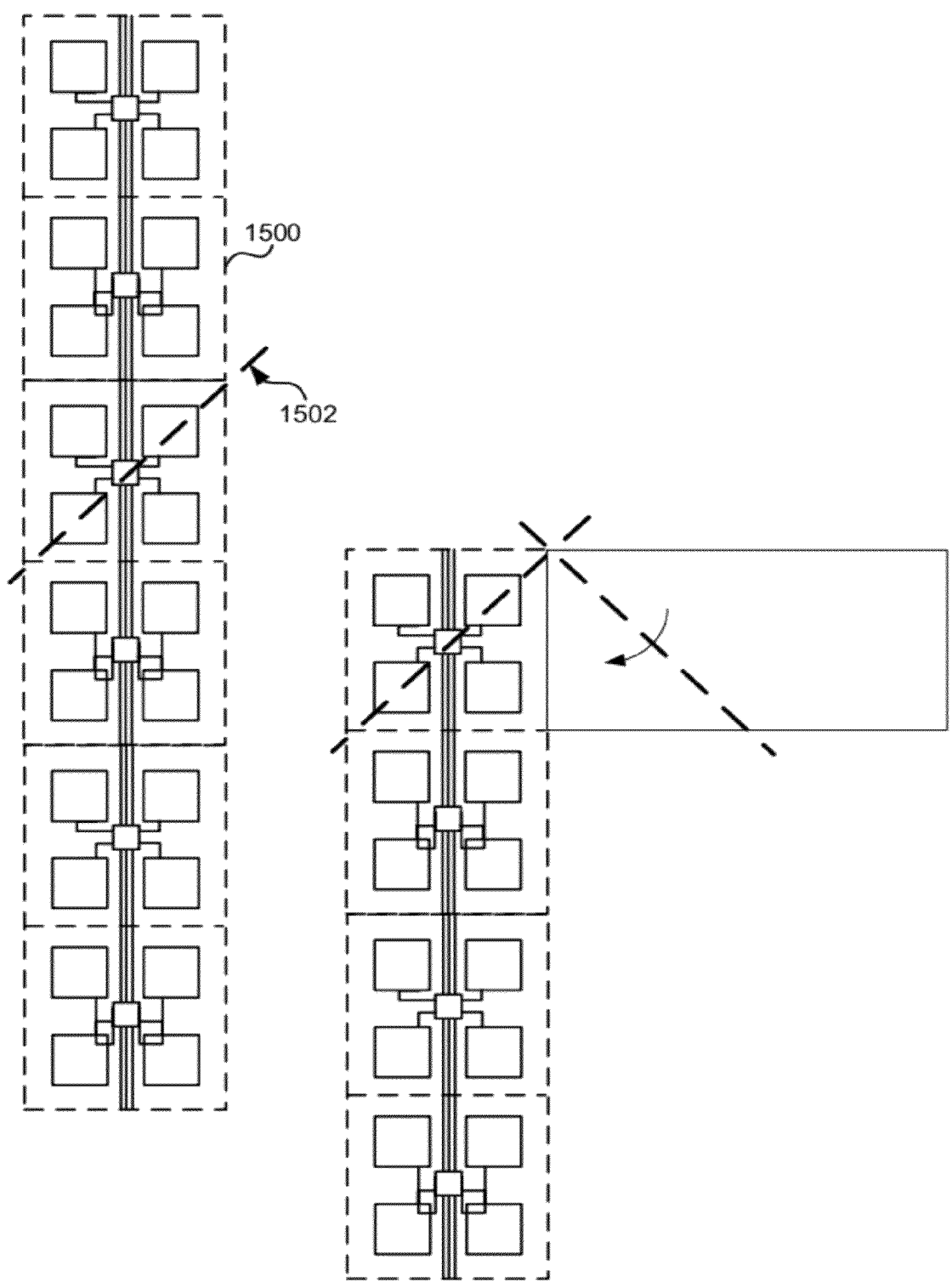
FIG. 15 is a schematic diagram showing folding of an example sensing floor.

The systems and methods described above provide sensing surfaces and systems which may be:

- scalable, i.e. it can be used for small areas (e.g. a desktop or mat) or for very large areas (e.g. entire rooms or buildings)
- capable of reduced power operation (e.g. through the use of wake-up signals as described with reference to FIG. 9)
- easy and quick to deploy (e.g. to install in a room or building), in particular where the substrate is flexible. In an example, the sensing floor may be delivered on a roll (in a similar manner to carpet and which may be many meters long) and instead of cutting the floor at the edges of a room, the sensing floor 1500 may be folded to make a 180° bend, as shown in the schematic diagram of FIG. 15 (where fold lines are shown by a dotted line 1502). The design of the connections on the floor may be arranged to prevent shorting when folded or an insulating layer may cover the sensing floor on the roll such that it can be folded without shorting.
- quick to fabricate (e.g. through the use of printed substrate technology)
- low cost (e.g. through the use of printed substrate technology which provides both the connectors and the sensing elements in a single printing operation and/or through the reduction in the amount of electronics required compared to known floor sensing systems)
- independent of the lighting conditions (unlike vision systems for locating people)

In addition, such systems have reduced privacy concerns/risks compared to system which use imaging/vision to locate people. The sensing surface can also be deployed irrespective of the underlying surface topology (i.e. it does not require a flat surface) through the use of a flexible substrate and in an example, the sensing floor may be laid up a flight of stairs to detect the location of people on the stairs (e.g. for security or safety reasons).

The term 'computer' is used herein to refer to any device with processing capability such that it can execute instructions. Those skilled in the art will realize that such processing capabilities are incorporated into many different devices and therefore the term 'computer' includes PCs, servers, mobile telephones, personal digital assistants and many other devices.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible (or non-transitory) storage media include disks, thumb drives, memory etc and do not include propagated signals. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

It will be understood that the above description of a preferred embodiment is given by way of example only and that various modifications may be made by those skilled in the art. The above specification, examples and data provide a complete description of the structure and use of exemplary embodiments of the invention. Although various embodiments of the invention have been described above with a certain degree of particularity, or with reference to one or more individual embodiments, those skilled in the art could make numerous alterations to the disclosed embodiments without departing from the spirit or scope of this invention.

The invention claimed is:

1. A sensing surface comprising:
   a flexible substrate;
   a plurality of distributed sensing elements and connections between the elements formed in a conductive material on the substrate, wherein the sensing elements are arranged to detect signals from the environment, the signals indicating a presence of at least a part of a person in proximity to a sensing element, the signals including mains hum traveling though the person, the plurality of distributed sensing elements on a part of the sensing surface arranged to operate in a selected one of a passive mode and an active mode and wherein, in the passive mode, the sensing elements in the part of the surface are arranged to use passive capacitive sensing of signals and, in the active mode, the plurality of distributed sensing elements in the part of the surface comprises:
      a first element arranged to transmit a signal; and
      at least one sensing element arranged to detect a signal transmitted by the first element;
   and any of:
      a microcontroller arranged to receive a mode selection signal from a master controller and to control operation of the plurality of distributed sensing elements in the part of the surface according to the mode selection signal received; or
      a microcontroller arranged to control operation of the part of the surface such that it switches from passive mode to active mode on detection of a signal from the environment at one of the sensing elements in the part of the surface and an antenna and associated receiver circuitry arranged to detect signals from a mobile device, the microcontroller being further arranged to wake the receiver circuitry from a sleep state on detection of the signal from the environment at one of the sensing elements in the part of the surface.

2. A sensing surface according to claim 1, wherein the sensing elements are arranged to use passive capacitive sensing of the signals.

3. A sensing surface according to claim 1, wherein the first element comprises a first sensing element.

4. A sensing surface according to claim 1, further comprising a microcontroller arranged to receive a mode selection signal from a master controller; and to control operation of the plurality of distributed sensing elements in the part of the surface according to the mode selection signal received.

5. A sensing surface according to claim 1, further comprising a microcontroller arranged to control operation of the part of the surface such that it switches from passive mode to active mode on detection of a signal from the environment at one of the sensing elements in the part of the surface.

6. A sensing surface according to claim 5, further comprising an antenna and associated receiver circuitry arranged to detect signals from a mobile device and wherein the microcontroller is further arranged to wake the receiver circuitry from a sleep state on detection of a signal from the environment at one of the sensing elements in the part of the surface.

7. A sensing surface according to claim 1, wherein the plurality of distributed sensing elements and connectors are formed in a conductive layer printed onto the flexible substrate.

8. A sensing surface according to claim 1, further comprising an antenna arranged to detect signals from a mobile device.

9. A method of operating a sensing system, the sensing system comprising a sensing surface and the sensing surface comprising a plurality of distributed sensing elements and connections between the elements formed in a conductive material on a flexible substrate, the method comprising:
   detecting, at a sensing element, signals from the environment; and
   analyzing the detected signals to determine a location of a person in proximity to the sensing surface, the signals including mains hum traveling through the person; and
   the method further comprising at least one of:
      a method for operating the sensing surface in an active or passive mode comprising:
         the plurality of distributed sensing elements on a part of the sensing surface being operated in a selected one of a passive mode and an active mode wherein, in the passive mode, the sensing elements in the part of the surface are arranged to use passive capacitive sensing of signals and, in the active mode, the plurality of distributed sensing elements in the part of the surface comprises:
            a first element arranged to transmit a signal; and
            at least one sensing element arranged to detect a signal transmitted by the first element;
         and any of:
            a microcontroller receiving a mode selection signal from a master controller and controlling operation of the plurality of distributed sensing elements in the part of the surface according to the mode selection signal received; or
            a microcontroller controlling operation of the part of the surface such that it switches from passive mode to active mode on detection of a signal from the environment at one of the sensing elements in the part of the surface and an antenna and associated receiver circuitry detecting signals from a mobile device, the microcontroller being arranged to wake the receiver circuitry from a sleep state on detection of the signal from the environment at one of the sensing elements in the part of the surface; or
      a method wherein the sensing surface comprises a first sensing surface and sensing system further comprises a second sensing surface and the method further comprising:
         comparing a first location of a person identified using detected signals from the first sensing surface and a second location of a person identified using detected signals from the second sensing surface to determine if the first and second locations relate to a single person.

10. A method according to claim 9, wherein detecting signals from the environment comprises a first mode of operation and the method further comprising a second mode of operation comprising:
   transmitting a signal from a first element; and
   detecting the signal at one or more other sensing elements, and wherein the detected signals, which are analyzed to determine a location of user, comprise signals generated in the first or the second mode of operation.

11. A method according to claim 10, further comprising:
   switching between the first and second modes of operation according to a mode selection signal received from a master controller.

12. A method according to claim 10, wherein the first element comprises a sensing element and transmitting a signal from a first element comprises:
selecting one of the sensing elements as a transmitter; and
transmitting the signal from the selected sensing element.

13. A method according to claim 10, further comprising:
operating the system in a first mode of operation; and
switching to the second mode of operation upon detection of a user in proximity to the sensing surface in the first mode of operation.

14. A method according to claim 9, wherein the sensing surface comprises a first sensing surface and sensing system further comprises a second sensing surface and the method further comprising:
comparing a first location of a person identified using detected signals from the first sensing surface and a second location of a person identified using detected signals from the second sensing surface to determine if the first and second locations relate to a single person.

15. A method according to claim 14, further comprising:
transferring data between a system associated with the first sensing surface and a system associated with the second sensing surface.

16. A method according to claim 9, further comprising:
analyzing the detected signals to determine an identity of the person user in proximity to the sensing surface.

17. A sensing surface comprising:
a flexible substrate;
a plurality of distributed electrodes and connectors between the electrodes formed in a conductive layer on the substrate;
a microcontroller arranged to control operation of a subset of the electrodes in a part of the surface such that in a first mode of operation, the subset of electrodes use passive capacitive sensing to detect signals from the environment relating to presence of a person, the signals including mains hum passing through the person, and in a second mode of operation, one electrode in the subset of electrodes transmits a signal for detection by another electrode when a user is in proximity to both electrodes; and
the microcontroller further arranged to perform at least one of:
receiving a mode selection signal from a master controller and controlling operation of the plurality of distributed sensing elements in the part of the surface according to the mode selection signal received;
controlling operation of the part of the surface such that it switches from passive mode to active mode on detection of a signal from the environment at one of the sensing elements in the part of the surface and receiving signals from an antenna and associated receiver circuitry detecting signals from a mobile device, the microcontroller being arranged to wake the receiver circuitry from a sleep state on detection of the signal from the environment at one of the sensing elements in the part of the surface; or
comparing a first location of a person identified using detected signals from a first sensing surface and a second location of a person identified using detected signals from a second sensing surface to determine if the first and second locations relate to a single person.

18. A sensing surface according to claim 17, the sensing surface comprising a sensing mat for use in playing computer games.

19. A method according to claim 9, further comprising:
identifying people on the sensing surface using the strength of capacitive signals detected by the sensing surface.

20. A method according to claim 9, wherein the sensing surface comprises a first sensing surface and sensing system further comprises a second sensing surface and a single user is identified as contacting both the first and second sensing surface, the method further comprising:
transferring data, through the user, between a display or computing device associated with the first sensing surface and a display or computing device associated with the second sensing surface.

* * * * *